(12) United States Patent
Fantini et al.

(10) Patent No.: US 12,419,200 B2
(45) Date of Patent: Sep. 16, 2025

(54) MEMORY CELL FORMATION IN THREE DIMENSIONAL MEMORY ARRAYS USING ATOMIC LAYER DEPOSITION

(71) Applicant: Micron Technology, Inc., Boise, ID (US)

(72) Inventors: Paolo Fantini, Vimercate (IT); Stephen W. Russell, Boise, ID (US); Enrico Varesi, Milan (IT); Lorenzo Fratin, Buccinasco (IT)

(73) Assignee: Micron Technology, Inc., Boise, ID (US)

( * ) Notice: Subject to any disclaimer, the term of this patent is extended or adjusted under 35 U.S.C. 154(b) by 527 days.

(21) Appl. No.: 17/660,939

(22) Filed: Apr. 27, 2022

(65) Prior Publication Data
US 2023/0354721 A1  Nov. 2, 2023

(51) Int. Cl.
H10B 63/00 (2023.01)
H10N 70/00 (2023.01)

(52) U.S. Cl.
CPC .......... *H10N 70/023* (2023.02); *H10B 63/34* (2023.02); *H10B 63/845* (2023.02); *H10N 70/066* (2023.02)

(58) Field of Classification Search
CPC .. H10N 70/023; H10N 70/066; H10N 70/823; H10N 70/231; H10N 70/8825; H10B 63/34; H10B 63/845; H10B 63/10; H10B 63/30; H01L 23/5283; H01L 21/76838
See application file for complete search history.

(56) References Cited

U.S. PATENT DOCUMENTS

| | | | |
|---|---|---|---|
| 10,381,559 B1 * | 8/2019 | Zhou | H10N 70/841 |
| 2017/0250224 A1 * | 8/2017 | Ratnam | H01L 29/1033 |
| 2020/0020718 A1 * | 1/2020 | Harari | H01L 21/76802 |
| 2023/0284459 A1 * | 9/2023 | Yoo | H10N 70/823 257/4 |

FOREIGN PATENT DOCUMENTS

WO  WO-2017131642 A1 *  8/2017  ............. H10B 63/20

* cited by examiner

*Primary Examiner* — Samuel Park
(74) *Attorney, Agent, or Firm* — Holland & Hart LLP

(57) ABSTRACT

Methods, systems, and devices for memory cell formation in three dimensional memory arrays using atomic layer deposition (ALD) are described. The method may include depositing a stack of layers over a substrate and forming multiple piers through the stacks of layers. The method may further include forming multiple cavities through the stacks of layers and forming multiple voids between layers of the stacks of layers. Additionally, the method may include forming multiple word lines based on depositing a conductive material in the voids and forming multiple memory cells based on depositing an active material on an inside surface of the cavities using ALD.

12 Claims, 14 Drawing Sheets

MEMORY CELL FORMATION IN THREE DIMENSIONAL MEMORY ARRAYS USING ATOMIC LAYER DEPOSITION

FIELD OF TECHNOLOGY

The following relates to one or more systems for memory, including memory cell formation in three dimensional memory arrays using atomic layer deposition (ALD).

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1A:
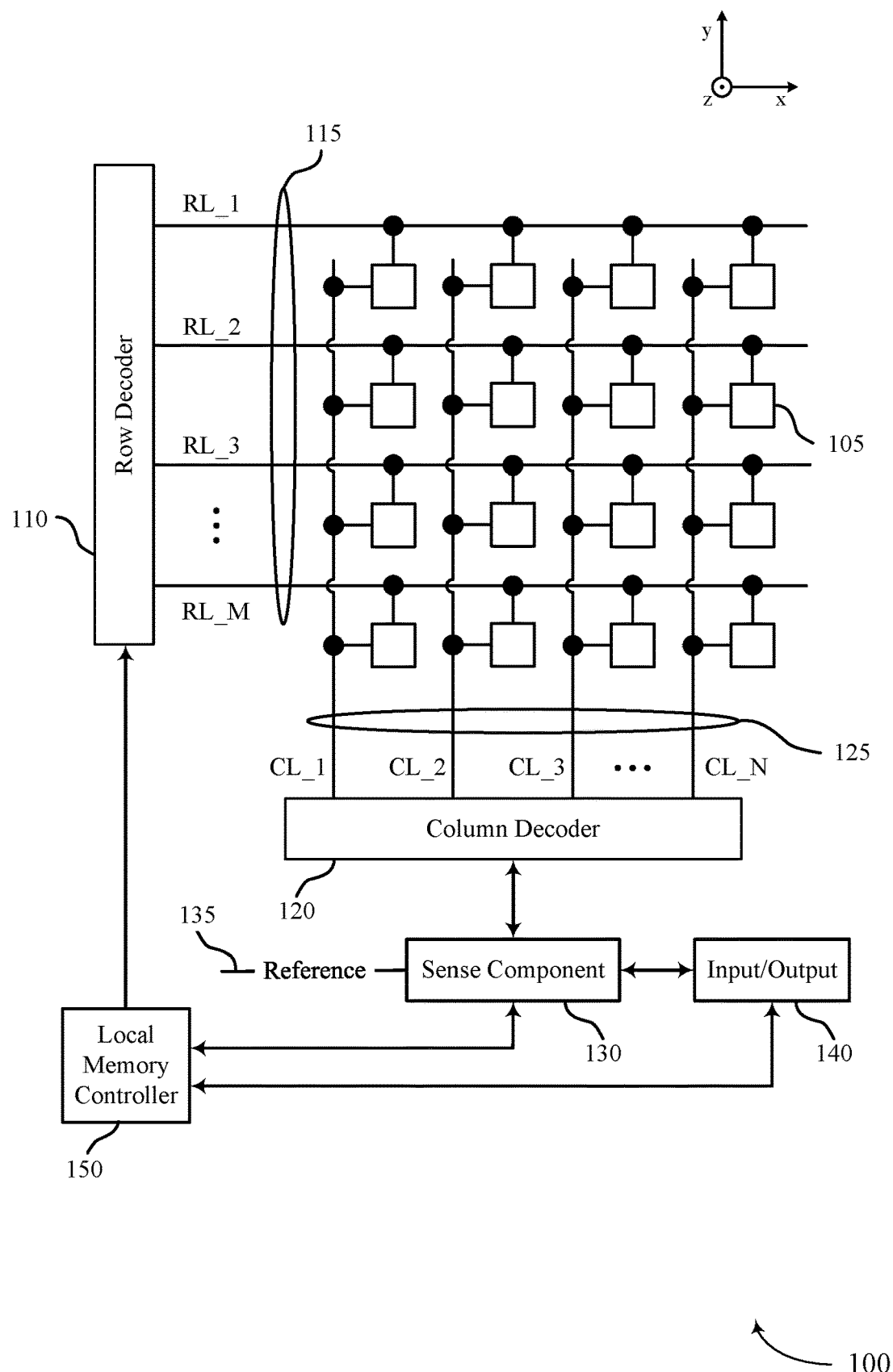
FIG. 1A illustrates an example of a memory array that supports memory cell formation in three dimensional memory arrays using atomic layer deposition (ALD) in accordance with examples as disclosed herein.

In some examples, features of three dimensional memory array may be formed using a lateral fill technique. For example, layers of materials may be deposited over a substrate and voids may be formed between the layers of material. Other material may be deposited into the voids to form features of the memory array. First, conductive material may be deposited into the voids to form access lines. Second, electrode material may be deposited into voids to form electrodes in contact with or otherwise over the access lines. Third, active material may be deposited into the voids to form memory cells in contact with or otherwise over the electrodes and fourth, electrode material may be deposited into a cavity formed through the layers of the material to form electrodes in contact with or otherwise over the memory cells. Additionally, piers may be formed through the layers of material to provide mechanical support to the layered material when the voids are formed. In some examples, the threshold voltage of a memory cell may be controlled by the distance between electrodes or the thickness of the active material. As described above, the distance between electrodes and the thickness of the active material may be defined by a sequence of (e.g., at least three) fill and recession processes. Defining the electrode distance or active material thickness in such a way, however, may result in differences between electrode distances of different memory cells and, in addition, differing memory cell thickness. That is, in some examples, the threshold voltage may change from memory cell to memory cell and differences in threshold voltages between memory cells may negatively impact subsequent access operations (e.g., read operations or write operations).

In accordance with examples as disclosed herein, a thickness of memory cell may be controlled by deposition, such as atomic layer deposition (ALD) (as opposed to multiple filling and recession steps in other different techniques). In some examples, layers of materials may be deposited over a substrate. In one example, the layers of material may include alternating layers of a first material and a second material. In some examples, a first cavity may be formed through the layers of material and the first cavity may be filled with a third material, for example, to form a pier. Additionally, a second cavity may be formed through the layers of material. In some examples, voids may be formed between the layers of material by removing the second material, and access lines may be formed by depositing conductive material in the voids. Moreover, memory cells may be formed, for example, on an inside surface of the second cavity by depositing active material on the inside surface of the second cavity using ALD. Using such techniques allows for better control of the thickness of the memory cell, which will reduce the threshold voltage variation across memory cells, among other benefits.

Features of the disclosure are initially described in the context of memory devices and arrays with reference to FIGS. 1A, 1B, 1C, and 1D. Features of the disclosure are described in the context of material arrangements and related manufacturing operations with reference to FIGS. 2A, 2B, 2C, 3A, 3B, 3C, 4, 5, and 6. These and other features of the disclosure are further illustrated by and described with reference to an apparatus diagram and flowcharts that relate to memory cell formation in three dimensional memory arrays using ALD as described with reference to FIGS. 7 and 8.

FIG. 1A illustrates an example of a memory device 100 that supports memory cell formation in three dimensional memory arrays using ALD in accordance with examples as disclosed herein. In some examples, the memory device 100 may be referred to as or include a memory die, a memory chip, or an electronic memory apparatus. The memory device 100 may be operable to provide locations to store information (e.g., physical memory addresses) that may be used by a system (e.g., a host device coupled with the memory device 100, for writing information, for reading information).

The memory device 100 may include one or more memory cells 105 that each may be programmable to store different logic states (e.g., a programmed one of a set of two or more possible states). For example, a memory cell 105 may be operable to store one bit of information at a time (e.g., a logic 0 or a logic 1). In some examples, a memory cell 105 (e.g., a multi-level memory cell 105) may be operable to store more than one bit of information at a time (e.g., a logic 00, logic 01, logic 10, a logic 11). In some examples, the memory cells 105 may be arranged in an array.

A memory cell 105 may store a logic state using a configurable material, which may be referred to as a memory element, a storage element, a memory storage element, a material element, a material memory element, a material portion, or a polarity-written material portion, among others. A configurable material of a memory cell 105 may refer to a chalcogenide-based storage component. For example, a chalcogenide storage element may be used in a phase change memory cell, a thresholding memory cell, or a self-selecting memory cell, among other architectures.

In some examples, the material of a memory cell 105 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide material may include additional elements such as hydrogen (H), oxygen (O), nitrogen (N), chlorine (Cl), or fluorine (F), each in atomic or molecular forms.

In some examples, a memory cell 105 may be an example of a phase change memory cell. In such examples, the material used in the memory cell 105 may be based on an alloy (such as the alloys listed above) and may be operated so as to change to different physical state (e.g., undergo a phase change) during normal operation of the memory cell 105. For example, a phase change memory cell 105 may be associated with a relatively disordered atomic configuration (e.g., a relatively amorphous state) and a relatively ordered atomic configuration (e.g., a relatively crystalline state). A relatively disordered atomic configuration may correspond to a first logic state (e.g., a RESET state, a logic 0) and a relatively ordered atomic configuration may correspond to a second logic state (e.g., a logic state different than the first logic state, a SET state, a logic 1).

In some examples (e.g., for thresholding memory cells 105, for self-selecting memory cells 105), some or all of the set of logic states supported by the memory cells 105 may be associated with a relatively disordered atomic configuration of a chalcogenide material (e.g., the material in an amorphous state may be operable to store different logic states). In some examples, the storage element of a memory cell 105 may be an example of a self-selecting storage element. In such examples, the material used in the memory cell 105 may be based on an alloy (e.g., such as the alloys listed above) and may be operated so as to undergo a change to a different physical state during normal operation of the memory cell 105. For example, a self-selecting or thresholding memory cell 105 may have a high threshold voltage state and a low threshold voltage state. A high threshold voltage state may correspond to a first logic state (e.g., a RESET state, a logic 0) and a low threshold voltage state may correspond to a second logic state (e.g., a logic state different than the first logic state, a SET state, a logic 1).

During a write operation (e.g., a programming operation) of a self-selecting or thresholding memory cell 105, a polarity used for a write operation may influence (e.g., determine, set, program) a behavior or characteristic of the material of the memory cell 105, such as a thresholding characteristic (e.g., a threshold voltage) of the material. A difference between thresholding characteristics of the material of the memory cell 105 for different logic states stored by the material of the memory cell 105 (e.g., a difference between threshold voltages when the material is storing a logic state '0' versus a logic state '1') may correspond to the read window of the memory cell 105.

The memory device 100 may include access lines (e.g., row lines 115 each extending along an illustrative x-direction, column lines 125 each extending along an illustrative y-direction) arranged in a pattern, such as a grid-like pattern. Access lines may be formed with one or more conductive materials. In some examples, row lines 115, or some portion thereof, may be referred to as word lines. In some examples, column lines 125, or some portion thereof, may be referred to as digit lines or bit lines. References to access lines, or their analogues, are interchangeable without loss of understanding. Memory cells 105 may be positioned at intersections of access lines, such as row lines 115 and the column lines 125. In some examples, memory cells 105 may also be arranged (e.g., addressed) along an illustrative z-direction, such as in an implementation of sets of memory cells 105 being located at different levels (e.g., layers, decks, planes, tiers) along the illustrative z-direction. In some examples, a memory device 100 that includes memory cells 105 at different levels may be supported by a different configuration of access lines, decoders, and other supporting circuitry than shown.

Operations such as read operations and write operations may be performed on the memory cells 105 by activating access lines such as one or more of a row line 115 or a column line 125, among other access lines associated with alternative configurations. For example, by activating a row line 115 and a column line 125 (e.g., applying a voltage to the row line 115 or the column line 125), a memory cell 105 may be accessed in accordance with their intersection. An intersection of a row line 115 and a column line 125, among other access lines, in various two-dimensional or three-dimensional configuration may be referred to as an address of a memory cell 105. In some examples, an access line may be a conductive line coupled with a memory cell 105 and may be used to perform access operations on the memory cell 105. In some examples, the memory device 100 may perform operations responsive to commands, which may be issued by a host device coupled with the memory device 100 or may be generated by the memory device 100 (e.g., by a local memory controller 150).

Accessing the memory cells 105 may be controlled through one or more decoders, such as a row decoder 110 or a column decoder 120, among other examples. For example, a row decoder 110 may receive a row address from the local memory controller 150 and activate a row line 115 based on the received row address. A column decoder 120 may receive a column address from the local memory controller 150 and may activate a column line 125 based on the received column address.

The sense component 130 may be operable to detect a state (e.g., a material state, a resistance state, a threshold state) of a memory cell 105 and determine a logic state of the memory cell 105 based on the detected state. The sense component 130 may include one or more sense amplifiers to convert (e.g., amplify) a signal resulting from accessing the memory cell 105 (e.g., a signal of a column line 125 or other access line). The sense component 130 may compare a signal detected from the memory cell 105 to a reference 135 (e.g., a reference voltage, a reference charge, a reference current). The detected logic state of the memory cell 105 may be provided as an output of the sense component 130 (e.g., to an input/output component 140), and may indicate the detected logic state to another component of the memory device 100 or to a host device coupled with the memory device 100.

The local memory controller 150 may control the accessing of memory cells 105 through the various components (e.g., a row decoder 110, a column decoder 120, a sense component 130, among other components). In some examples, one or more of a row decoder 110, a column decoder 120, and a sense component 130 may be co-located with the local memory controller 150. The local memory controller 150 may be operable to receive information (e.g., commands, data) from one or more different controllers (e.g., an external memory controller associated with a host device, another controller associated with the memory device 100), translate the information into a signaling that can be used by the memory device 100, perform one or more operations on the memory cells 105 and communicate data from the memory device 100 to a host device based on performing the one or more operations. The local memory controller 150 may generate row address signals and column address signals to activate access lines such as a target row line 115 and a target column line 125. The local memory controller 150 also may generate and control various signals (e.g., voltages, currents) used during the operation of the memory device 100. In general, the amplitude, the shape, or the duration of an applied signal discussed herein may be varied and may be different for the various operations discussed in operating the memory device 100.

The local memory controller 150 may be operable to perform one or more access operations on one or more memory cells 105 of the memory device 100. Examples of access operations may include a write operation, a read operation, a refresh operation, a precharge operation, or an activate operation, among others. In some examples, access operations may be performed by or otherwise coordinated by the local memory controller 150 in response to access commands (e.g., from a host device). The local memory controller 150 may be operable to perform other access operations not listed here or other operations related to the operating of the memory device 100 that are not directly related to accessing the memory cells 105.

As described herein, a memory die that includes one or more aspects of a memory device 100 may include memory cells 105 that are formed using an ALD process. In some examples, the memory die may include alternating layers of a first material and a second material. Pier structures may be formed in contact with the layers of materials such that when, either the first material or the second material is removed to form voids, the pier structure may provide physical support. In some examples, a cavity may be formed though the layers of materials and either the first material or the second material may be removed to form voids in the layers of material. To form access lines, conductive material may be deposited in the voids and to form the memory cells 105, active material may be deposited on an inside surface of the cavity using ALD. Using the techniques as described herein may allow for control of a thickness of the memory cell 105, which may reduce the variation in a threshold voltage between memory cells.

The memory device 100 may include any quantity of non-transitory computer readable media that support memory cell formation in three dimensional memory arrays using ALD. For example, a local memory controller 150, a row decoder 110, a column decoder 120, a sense component 130, or an input/output component 140, or any combination thereof may include or may access one or more non-transitory computer readable media storing instructions (e.g., firmware) for performing the functions ascribed herein to the memory device 100. For example, such instructions, if executed by the memory device 100, may cause the memory device 100 to perform one or more associated functions as described herein.

Figure 1B:
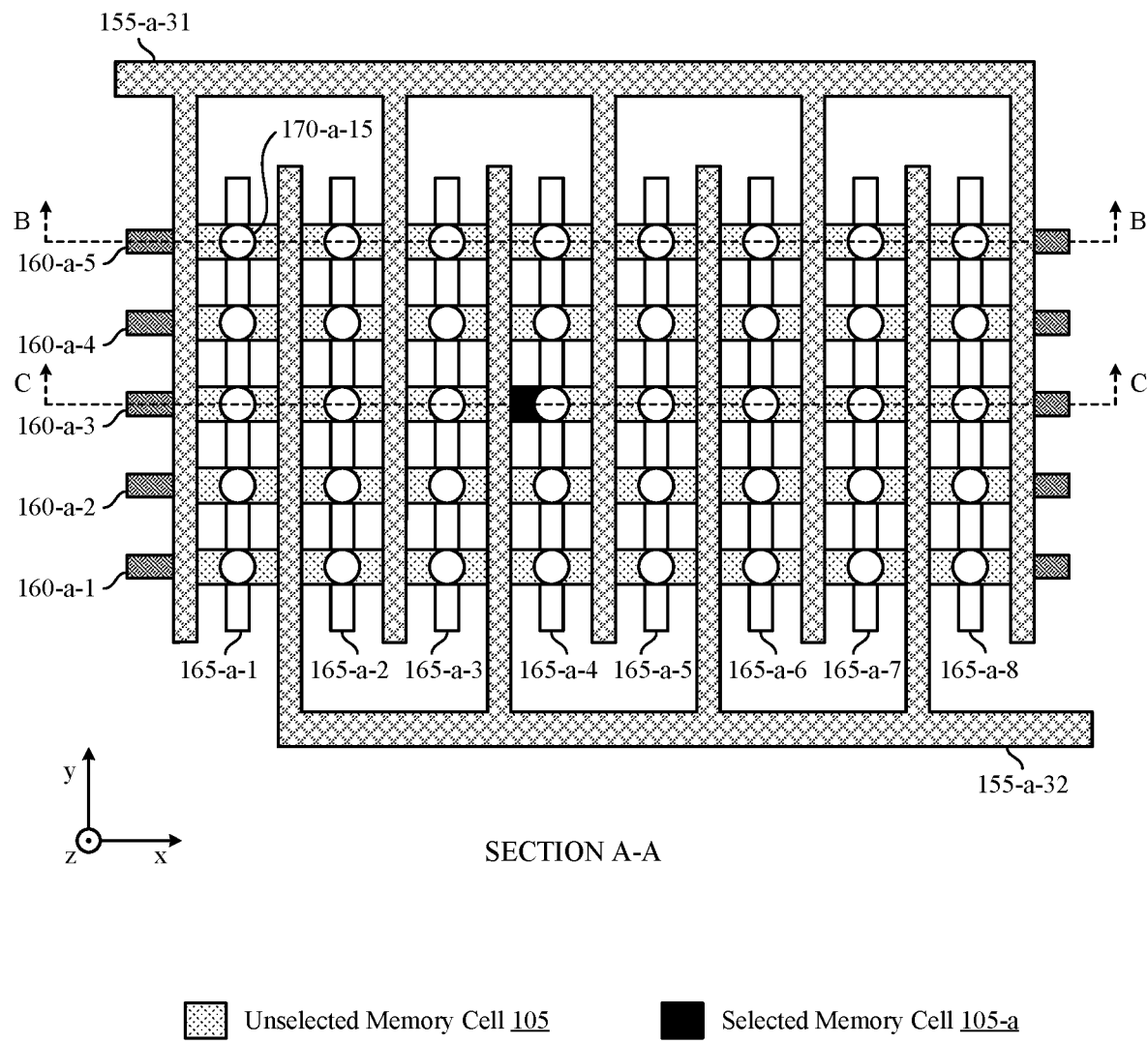
FIG. 1B illustrates a top view of an example of a memory array that supports memory cell formation in three dimensional memory arrays using ALD in accordance with examples as disclosed herein.
Figure 1C:
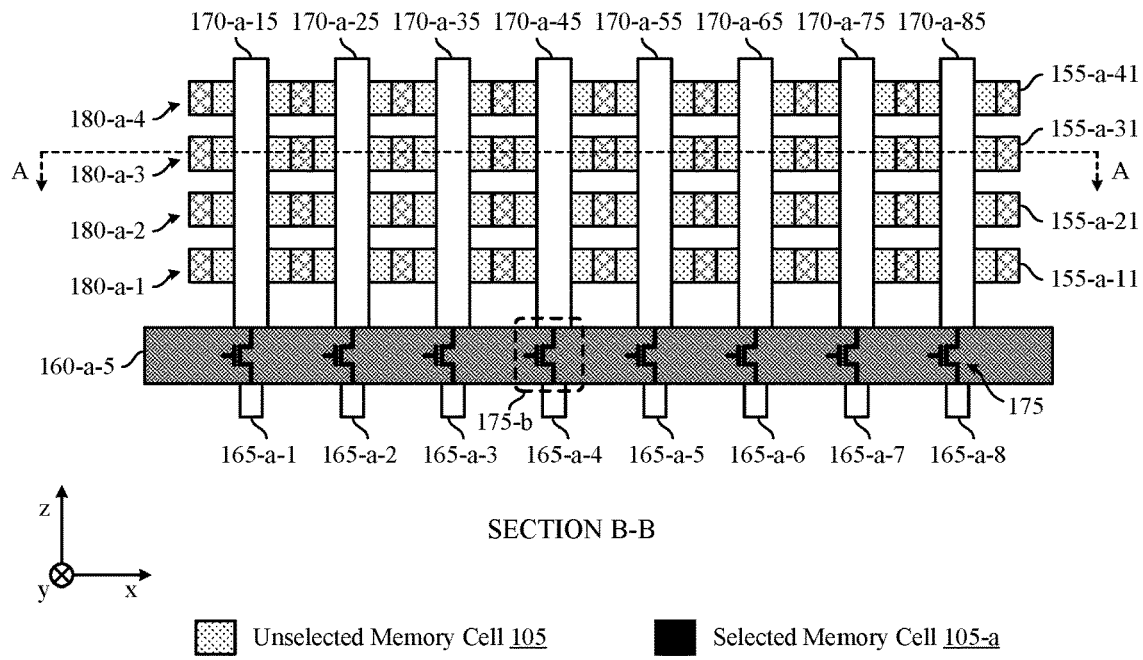
FIGS. 1C and 1D illustrate side views of an example of a memory array that supports memory cell formation in three dimensional memory arrays using ALD in accordance with examples as disclosed herein.
Figure 1D:
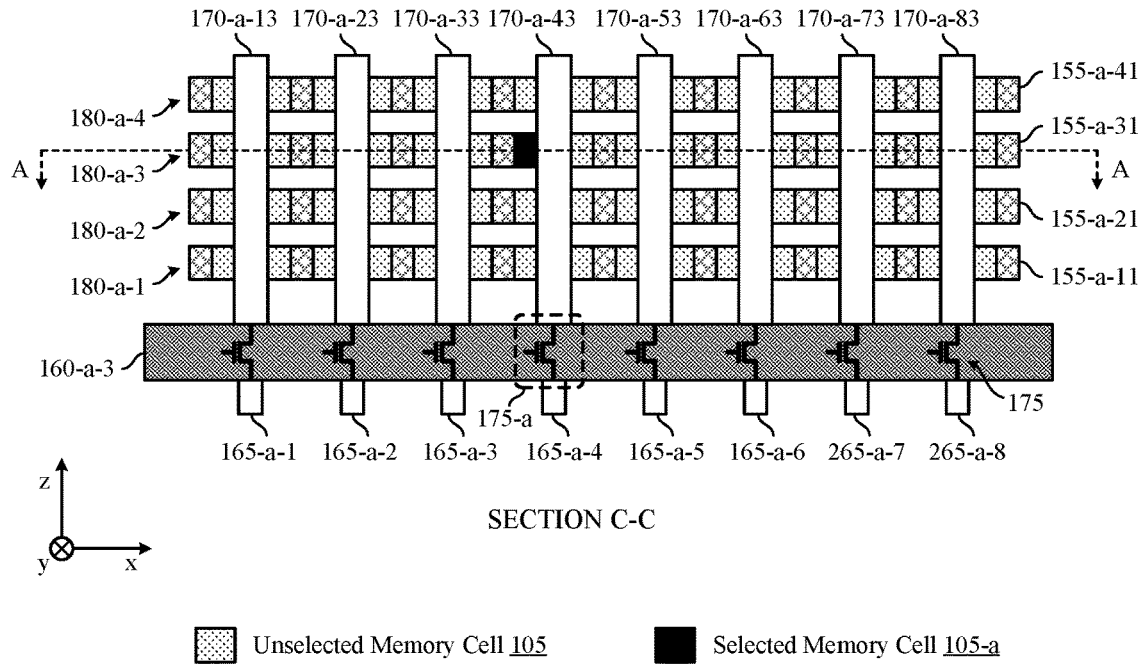

FIGS. 1B, 1C, and 1D illustrate an example of a memory array 101 that supports memory cell formation in three dimensional memory arrays using ALD in accordance with examples as disclosed herein. The memory array 101 may be included in a memory device 100, and illustrates an example of a three-dimensional arrangement of memory cells 105 that may be accessed by various conductive structures (e.g., access lines). FIG. 1B illustrates a top section view (e.g., SECTION A-A) of the memory array 101 relative to a cut plane A-A as shown in FIGS. 1C and 1D. FIG. 1C illustrates a side section view (e.g., SECTION B-B) of the memory array 101 relative to a cut plane B-B as shown in FIG. 1B. FIG. 1D illustrates a side section view (e.g., SECTION C-C) of the memory array 101 relative to a cut plane C-C as shown in FIG. 1B. The section views may be examples of cross-sectional views of the memory array 101 with some aspects (e.g., dielectric structures) removed for clarity. Elements of the memory array 101 may be described relative to an x-direction, a y-direction, and a z-direction, as illustrated in each of FIGS. 1B, 1C, and 1D. Although some elements included in FIGS. 1B, 1C, and 1D are labeled with a numeric indicator, other corresponding elements are not labeled, although they are the same or would be understood to be similar, in an effort to increase visibility and clarity of the depicted features. Further, although some quantities of repeated elements are shown in the illustrative example of memory array 101, techniques in accordance with examples as described herein may be applicable to any quantity of such elements, or ratios of quantities between one repeated element and another.

In the example of memory array 101, memory cells 105 and word lines 155 may be distributed along the z-direction according to levels 180 (e.g., decks, layers, planes, tiers, as illustrated in FIGS. 1C and 1D). In some examples, the z-direction may be orthogonal to a substrate (not shown) of the memory array 101, which may be below the illustrated structures along the z-direction. Although the illustrative example of memory array 101 includes four levels 180, a memory array 101 in accordance with examples as disclosed herein may include any quantity of one or more levels 180 (e.g., 64 levels, 128 levels) along the z-direction.

Each word line 155 may be an example of a portion of an access line that is formed by one or more conductive materials (e.g., one or more metal portions, one or more metal alloy portions). As illustrated, a word line 155 may be formed in a comb structure, including portions (e.g., projections, tines) extending along the y-direction through gaps (e.g., alternating gaps) between pillars 170. For example, as illustrated, the memory array 101, may include two word lines 155 per level 180 (e.g., according to odd word lines 155-a-n1 and even word lines 155-a-n2 for a given level, n), where such word lines 155 of the same level 180 may be described as being interleaved (e.g., with portions of an odd word line 155-a-n1 projecting along the y-direction between portions of an even word line 155-a-n2, and vice versa). In some examples, an odd word line 155 (e.g., of a level 180) may be associated with a first memory cell 105 on a first side (e.g., along the x-direction) of a given pillar 170 and an even word line (e.g., of the same level 180) may be associated with a second memory cell 105 on a second side (e.g., along the x-direction, opposite the first memory cell 105) of the given pillar 170. Thus, in some examples, memory cells 105 of a given level 180 may be addressed (e.g., selected, activated) in accordance with an even word line 155 or an odd word line 155.

Each pillar 170 may be an example of a portion of an access line (e.g., a conductive pillar portion) that is formed by one or more conductive materials (e.g., one or more metal portions, one or more metal alloy portions). As illustrated, the pillars 170 may be arranged in a two-dimensional array (e.g., in an xy-plane) having a first quantity of pillars 170 along a first direction (e.g., eight pillars along the x-direction, eight rows of pillars), and having a second quantity of pillars 170 along a second direction (e.g., five pillars along the y-direction, five columns of pillars). Although the illustrative example of memory array 101 includes a two-dimensional arrangement of eight pillars 170 along the x-direction and five pillars 170 along the y-direction, a memory array 101 in accordance with examples as disclosed herein may include any quantity of pillars 170 along the x-direction and any quantity of pillars 170 along the y-direction. Further, as illustrated, each pillar 170 may be coupled with a respective set of memory cells 105 (e.g., along the z-direction, one or more memory cells 105 for each level 180). A pillar 170 may have a cross-sectional area in an xy-plane that extends along the z-direction. Although illustrated with a circular cross-sectional area in the xy-plane, a pillar 170 may be formed with a different shape, such as having an elliptical, square, rectangular, polygonal, or other cross-sectional area in an xy-plane.

The memory cells 105 each may include a chalcogenide material. In some examples, the memory cells 105 may be examples of thresholding memory cells. Each memory cell 105 may be accessed (e.g., addressed, selected) according to an intersection between a word line 155 (e.g., a level selection, which may include an even or odd selection within a level 180) and a pillar 170. For example, as illustrated, a selected memory cell 105-a of the level 180-a-3 may be accessed according to an intersection between the pillar 170-a-43 and the word line 155-a-32.

A memory cell 105 may be accessed (e.g., written to, read from) by applying an access bias (e.g., an access voltage, $V_{access}$, which may be a positive voltage or a negative voltage) across the memory cell 105. In some examples, an access bias may be applied by biasing a selected word line 155 with a first voltage (e.g., $V_{access}/2$) and by biasing a selected pillar 170 with a second voltage (e.g., $-V_{access}/2$), which may have an opposite sign relative to the first voltage. Regarding the selected memory cell 105-a, a corresponding access bias (e.g., the first voltage) may be applied to the word line 155-a-32, while other unselected word lines 155 may be grounded (e.g., biased to 0V). In some examples, a word line bias may be provided by a word line driver (not shown) coupled with one or more of the word lines 155.

To apply a corresponding access bias (e.g., the second voltage) to a pillar 170, the pillars 170 may be configured to be selectively coupled with a sense line 165 (e.g., a digit line, a column line, an access line extending along the y-direction) via a respective transistor 175 coupled between (e.g., physically, electrically) the pillar 170 and the sense line 165. In some examples, the transistors 175 may be vertical transistors (e.g., transistors having a channel along the z-direction, transistors having a semiconductor junction along the z-direction), which may be formed above the substrate of the memory array 101 using various techniques (e.g., thin film techniques). In some examples, a selected pillar 170, a selected sense line 165, or a combination thereof may be an example of a selected column line 125 described with reference to FIG. 1A (e.g., a bit line).

The transistors 175 (e.g., a channel portion of the transistors 175) may be activated by gate lines 160 (e.g., activation lines, selection lines, a row line, an access line extending along the x-direction) coupled with respective gates of a set of the transistors 175 (e.g., a set along the x-direction). In other words, each of the pillars 170 may have a first end (e.g., towards the negative z-direction, a bottom end) configured for coupling with an access line (e.g., a sense line 165). In some examples, the gate lines 160, the transistors 175, or both may be considered to be components of a row decoder 110 (e.g., as pillar decoder components). In some examples, the selection of (e.g., biasing of) pillars 170, or sense lines 165, or various combinations thereof, may be supported by a column decoder 120, or a sense component 130, or both.

To apply the corresponding access bias (e.g., $-V_{access}/2$) to the pillar 170-a-43, the sense line 165-a-4 may be biased with the access bias, and the gate line 160-a-3 may be grounded (e.g., biased to 0V) or otherwise biased with an activation voltage. In an example where the transistors 175 are n-type transistors, the gate line 160-a-3 being biased with a voltage that is relatively higher than the sense line 165-a-4 may activate the transistor 175-a (e.g., cause the transistor 175-a to operate in a conducting state), thereby coupling the pillar 170-a-43 with the sense line 165-a-4 and biasing the pillar 170-a-43 with the associated access bias. However, the transistors 175 may include different channel types, or may be operated in accordance with different biasing schemes, to support various access operations.

In some examples, unselected pillars 170 of the memory array 101 may be electrically floating when the transistor 175-a is activated, or may be coupled with another voltage source (e.g., grounded, via a high-resistance path, via a leakage path) to avoid a voltage drift of the pillars 170. For example, a ground voltage being applied to the gate line 160-a-3 may not activate other transistors coupled with the gate line 160-a-3, because the ground voltage of the gate line 160-a-3 may not be greater than the voltage of the other sense lines 165 (e.g., which may be biased with a ground voltage or may be floating). Further, other unselected gate lines 160, including gate line 160-a-5 as shown in FIG. 1C, may be biased with a voltage equal to or similar to an access bias (e.g., $-V_{access}/2$, or some other negative bias or bias relatively near the access bias voltage), such that transistors 175 along an unselected gate line 160 are not activated. Thus, the transistor 175-b coupled with the gate line 160-a-5 may be deactivated (e.g., operating in a non-conductive state), thereby isolating the voltage of the sense line 165-a-4 from the pillar 170-a-45, among other pillars 170.

In a write operation, a memory cell 105 may be written to by applying a write bias (e.g., where $V_{access}=V_{write}$, which may be a positive voltage or a negative voltage) across the memory cell 105. In some examples, a polarity of a write bias may influence (e.g., determine, set, program) a behavior or characteristic of the material of the memory cell 105, such as the threshold voltage of the material. For example, applying a write bias with a first polarity may set the material of the memory cell 105 with a first threshold voltage, which may be associated with storing a logic 0. Further, applying a write bias with a second polarity (e.g., opposite the first polarity) may set the material of the memory cell with a second threshold voltage, which may be associated with storing a logic 1. A difference between threshold voltages of the material of the memory cell 105 for different logic states stored by the material of the memory cell 105 (e.g., a difference between threshold voltages when the material is storing a logic state '0' versus a logic state '1') may correspond to the read window of the memory cell 105.

In a read operation, a memory cell 105 may be read from by applying a read bias (e.g., where $V_{access}=V_{read}$, which may be a positive voltage or a negative voltage) across the memory cell 105. In some examples, a logic state of the memory cell 105 may be evaluated based on whether the memory cell 105 thresholds in the presence of the applied read bias. For example, such a read bias may cause a memory cell 105 storing a first logic state (e.g., a logic 0) to threshold (e.g., permit a current flow, permit a current above a threshold current), and may not cause a memory cell 105 storing a second logic state (e.g., a logic 1) to threshold (e.g., may not permit a current flow, may permit a current below a threshold current).

As described herein, a memory die that includes one or more aspects of a memory array 101 may include memory cells 105 that are formed using an ALD process. In some examples, the memory die may include alternating layers of a first material and a second material. Pier structures may be formed in contact with the layers of materials such that when, either the first material or the second material is removed to form voids, the pier structure may provide physical support. In some examples, a cavity may be formed though the layers of materials and either the first material or the second material may be removed to form voids in the layers of material. To form access lines, conductive material may be deposited in the voids and to form the memory cells 105, active material may be deposited on an inside surface of the cavity, for example, using ALD. Using the techniques as described herein will allow for control of a thickness of the memory cell 105, which will reduce the variation in a threshold voltage between memory cells, among other aspects.

FIGS. 2A, 2B, 2C, 3A, 3B, 3C, 4, 5, and 6 illustrate examples of operations that support memory cell formation in a three-dimensional memory array using ALD in accordance with example as disclosed herein. FIGS. 2A, 2B, 2C, 3A, 3B, 3C, 4, 5, and 6 illustrate aspects of a sequence of operations for fabricating aspects of a material arrangement, which may be a portion of a memory device (e.g., a memory device 100) or a portion of a memory array. Some of the provided figures include top views and section views. The section views illustrate example of cross-sections of the material arrangement. Although the material arrangement 200 illustrates examples of certain relative dimensions and quantities of various features, aspects of the material arrangement 200 may be implemented with other relative dimensions or quantities of such features in accordance with examples as disclosed herein.

Operations illustrated in and described with reference to FIGS. 2A, 2B, 2C, 3A, 3B, 3C, 4, 5, and 6 may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein.

Figure 2A:
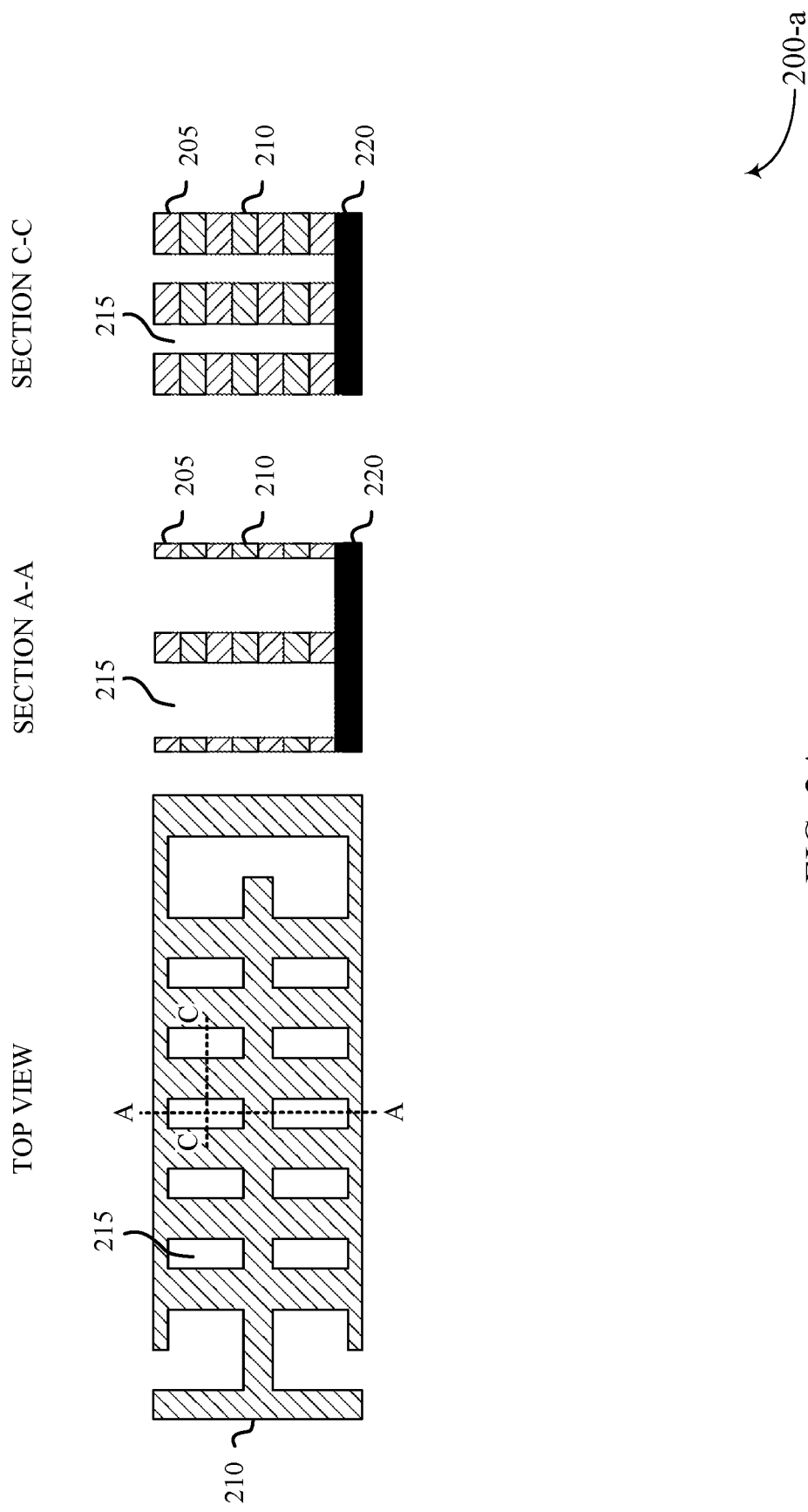
FIGS. 2A, 2B, 2C, 3A, 3B, 3C, 4, 5, and 6 illustrate examples of operations that support memory cell formation in three dimensional memory arrays using ALD in accordance with examples as disclosed herein.

FIG. 2A illustrates an example of a portion 200 of the material arrangement after a first set of one or more manufacturing operations. The first set of manufacturing operations may include depositing a stack of layers over a substrate 220. The substrate 220 may be semiconductor wafer or other substrate over which the stack of layer is deposited. The stack of layers may include a first material 205 and a second material 210. In some examples, the first material 205 may include a dielectric material (e.g., a tier oxide) and may provide electrical isolation between levels. The second material 210 may be different from the first material. For example, the second material 210 may include a dielectric material (e.g., a tier nitride).

The first set of manufacturing operations may also include operations that support forming piers. For example, the first set of manufacturing operations may include forming a set of cavities 215 (e.g., a set of first cavities) through the stacks of layers. The cavities 215 may be formed by removing portions of the first material 205 and the second material 210.

Figure 2B:
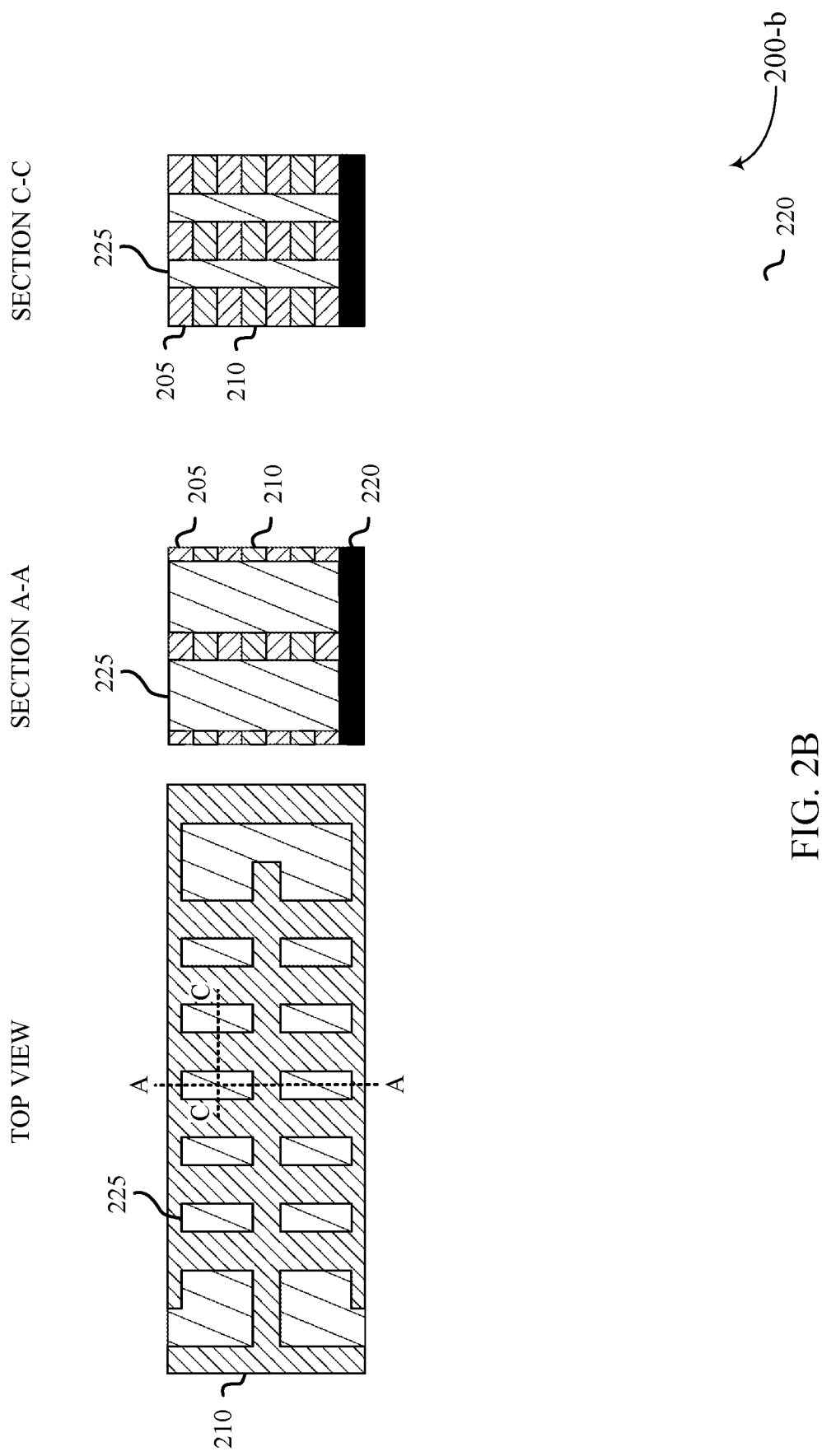

FIG. 2B illustrates a portion 200-b of the material arrangement after a second set of one or more manufacturing operations. The second set of manufacturing operations may include forming a set of piers 225 through the stacks of layers by depositing one or more materials (e.g., one or more third materials) such as a dielectric material (e.g., a second dielectric material) or a semiconductor (e.g., a polysilicon), among other materials, in the cavities 215. In some examples, the material of the piers 225 may be the same material as the first material 205 (e.g., a pier oxide). In some examples, the piers 225 may be formed from multiple materials, such as when piers 225 are formed by depositing a liner material in the cavities 215, followed by filling the liner material. In some examples, the second set of one or more manufacturing operations may include a polishing or planarization operation to flatten a top surface of the material arrangement, which may support aspects of subsequent operations.

Figure 2C:
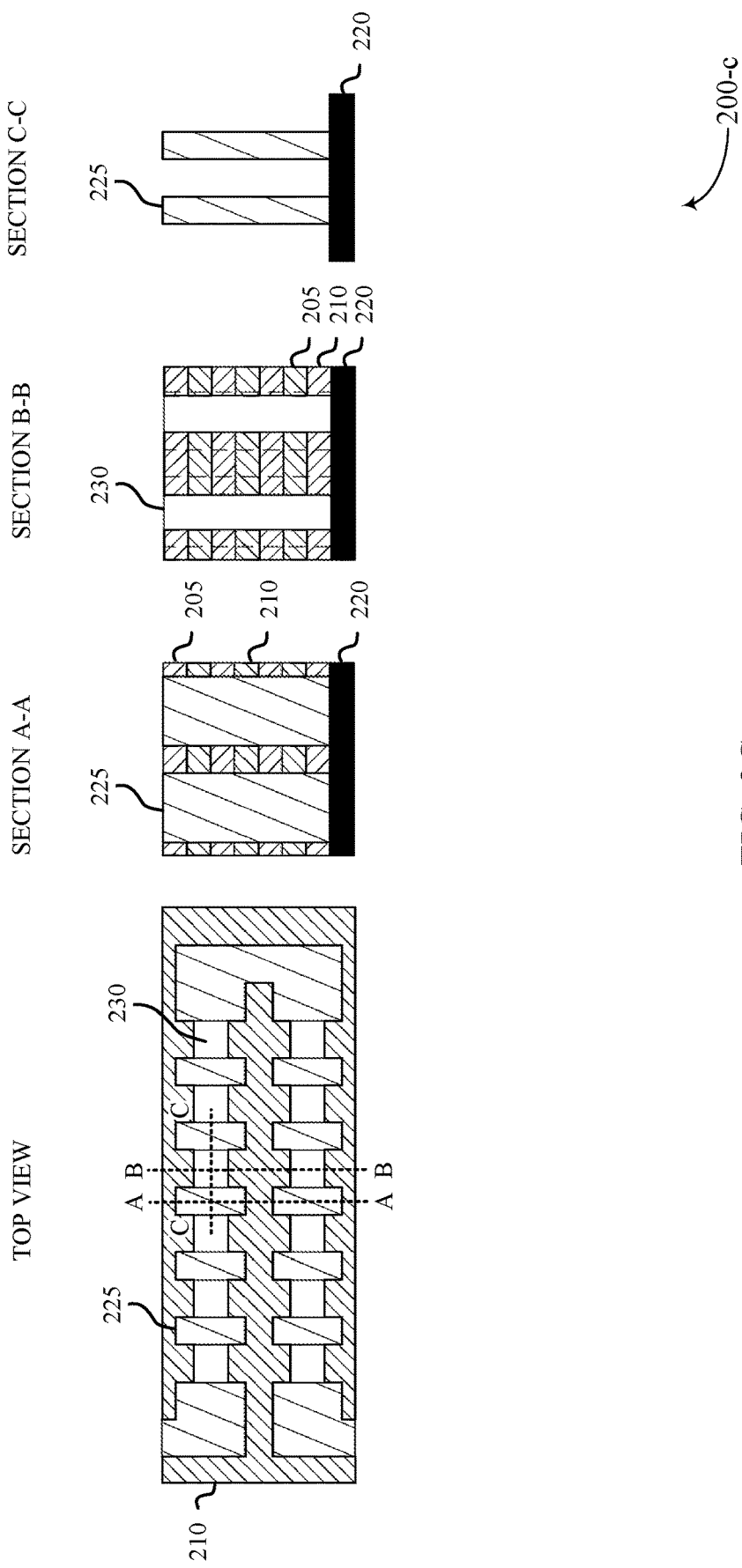

FIG. 2C illustrates portion 200-c of a material arrangement after a third set of one or more manufacturing operations. The third set of one or more manufacturing operations may include forming a set of cavities 230 (e.g., a set of second cavities) through the stack of layers. The set of cavities 230 may be formed by removing portions of the first material 205 and the second material 210. In some examples, the cavities 230 may be situated between two piers 225 (e.g., two adjacent piers 225).

Figure 3A:
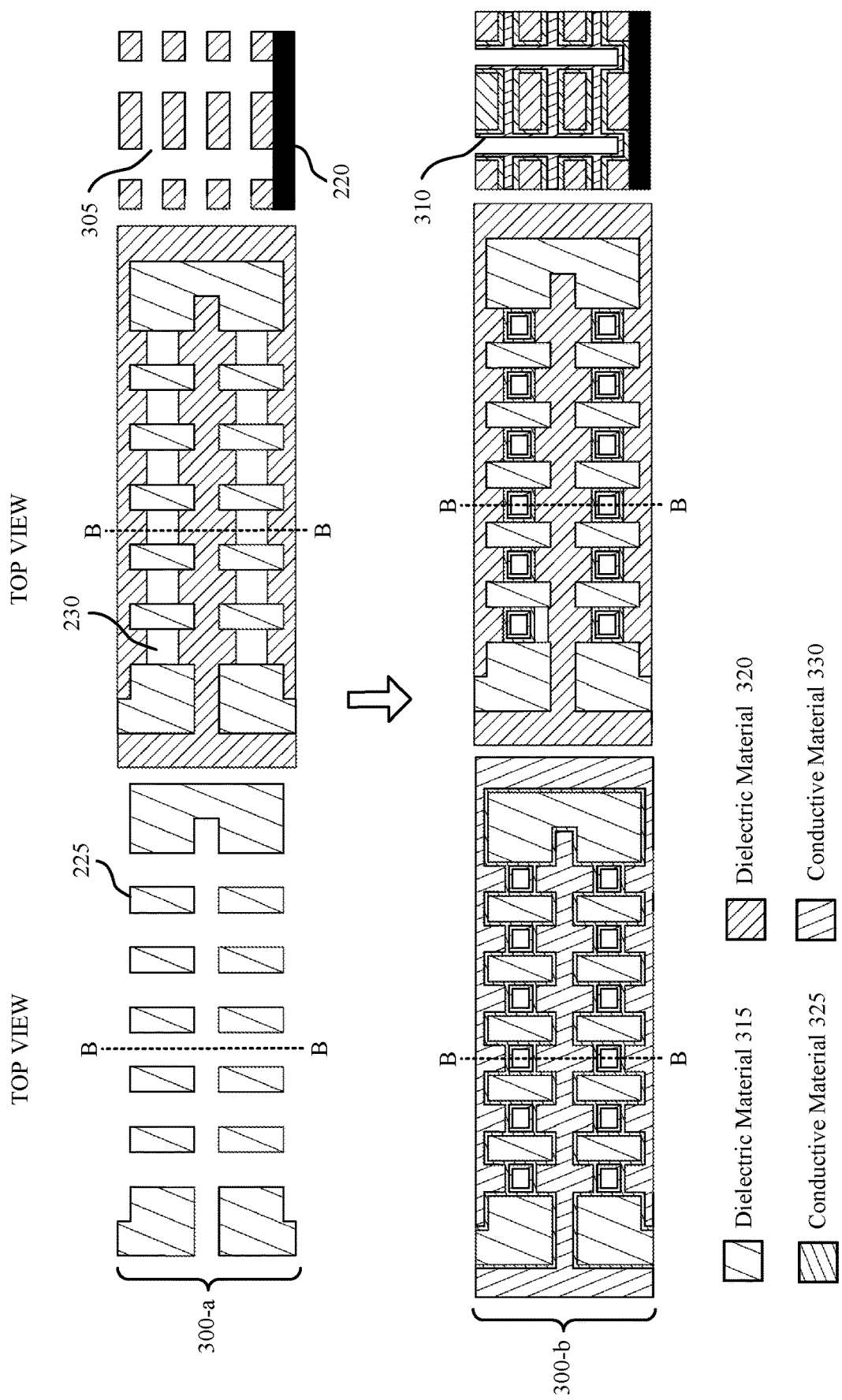

FIG. 3A illustrates an example of a portion 300-a of the material arrangement after a fourth set of one or more manufacturing operations and a portion 300-b of the material arrangement after a fifth set of one or more manufacturing operations. The fourth set of one or more manufacturing operations may occur after the third set of one or more manufacturing operations and may support forming a set of voids 305 between the layers of materials. For example, the fourth set of one or more manufacturing operations may include removing (e.g., etching, exhuming) the second material (e.g., a second material 210), which may form a set of voids 305 between the layers of the first material (e.g., the dielectric material 320). The fourth set of one or more manufacturing operations may expose sidewall, or portion thereof, of the piers 225 (e.g., the dielectric material 315). The piers 225 may remain in contact with the layers of the first material and provide support for the layers of the first material.

The fifth set of the one or more manufacturing operations may occur after the fourth set of the one or more manufacturing operations and may support forming a set of word lines 310 based on depositing one or more conductive materials (e.g., one or more of a conductive material 325 and a conductive material 330) in the set of voids 305. For example, the fifth set of one or more manufacturing operations may include depositing the conductive material 325 on exposed surfaces of the material arrangement, which may include depositing the conductive material 325 in contact with or otherwise over the layers of the first material (e.g., the dielectric material 320), in contact with or otherwise over the substrate 220, and in contact with or otherwise over the exposed sidewalls, or portions thereof, of the piers 225. In some examples, the conductive material 325 may include a barrier material (e.g., a conductive barrier, a liner materials, or a ceramic material) such as titanium nitride, titanium nitride, or tungsten silicon nitride, or others.

In some examples, the fifth set of one or more operations may include depositing a conductive material 330 on exposed surfaces of the conductive material 325, which may include depositing the conductive material 330 in contact with or otherwise over the conductive material 325 to fill the remaining portion of the set of voids 305. In some examples, the conductive material 330 may include a metal material, such as tungsten or a metal alloy. In some examples, the fifth set of one or more manufacturing operations may include depositing a single conductive material (e.g., omitting a barrier material), such as when the single conductive material is compatible with adjacent materials (e.g., compatible with the substrate 220, compatible with the first material, compatible with a material deposited in contact with or otherwise over the single conductive material in a later operation).

Figure 3B:
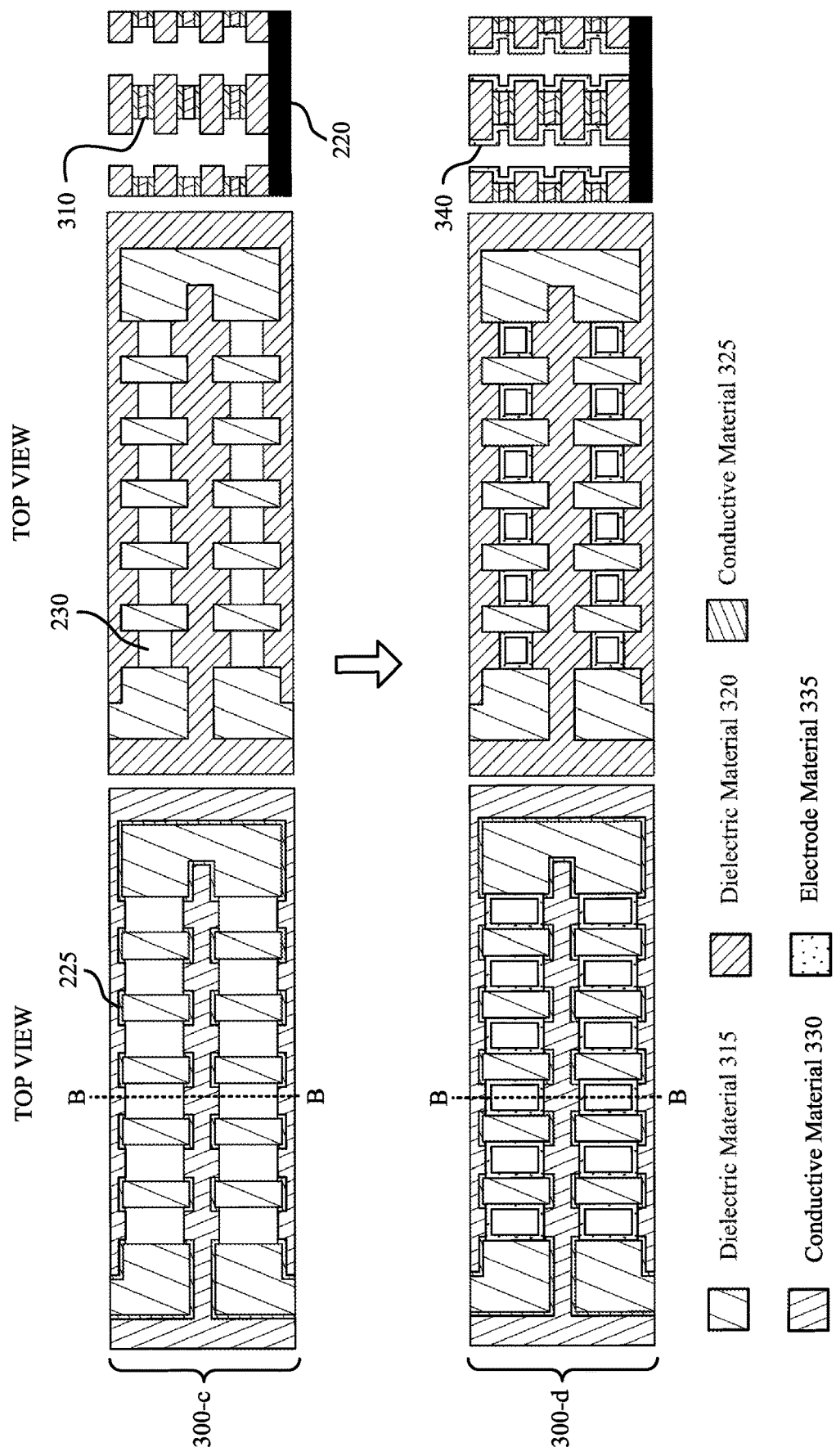

FIG. 3B illustrates a portion illustrates a portion 300-c of the material arrangement after a sixth set of one or more manufacturing operations and a portion 300-d of the material arrangement after a seventh set of one or more manufacturing operations. The sixth set of one or more manufacturing operations may occur after the fifth set of one or more manufacturing operations and may support forming the word lines 310. For example, the sixth set of one or more manufacturing operation may include removing (e.g., etching or exhuming) exposed portions of the conductive material 325 and the conductive material 330, which may recess portions of the conductive material 325 and the conductive material 330 to be within the void 305, and which may expose the substrate 220 and at least sidewalls of the first material (e.g., the dielectric material 320). Such operation may clear the conductive material 330 and the conductive material 324 from the cavities 230.

The seventh set of one or more manufacturing operations may occur after the sixth set of one or more operations and may support forming electrodes 340 (e.g., thin film electrode deposition). For example, the seventh set of one or more manufacturing operations may include depositing electrode material 335 on the exposed surfaces of the material arrangement, which may include depositing the electrode material 335 in contact with or otherwise over the layers of the first material (e.g., the dielectric material 320), in contact with or otherwise over the word lines 310, in contact with or otherwise over the exposed sidewalls, or a portion thereof, of the piers 225 (e.g., the dielectric material 315). As shown in FIG. 3B, the electrode material 335 may form a film on the exposed portions of the voids 305 not occupied by the word lines 310. That is, the electrode material 335 may form a shape, such as a cup shape, on an inside surface of the exposed portions of the voids 305. In some examples, the electrode material 335 may be a metal or a carbide.

Figure 3C:
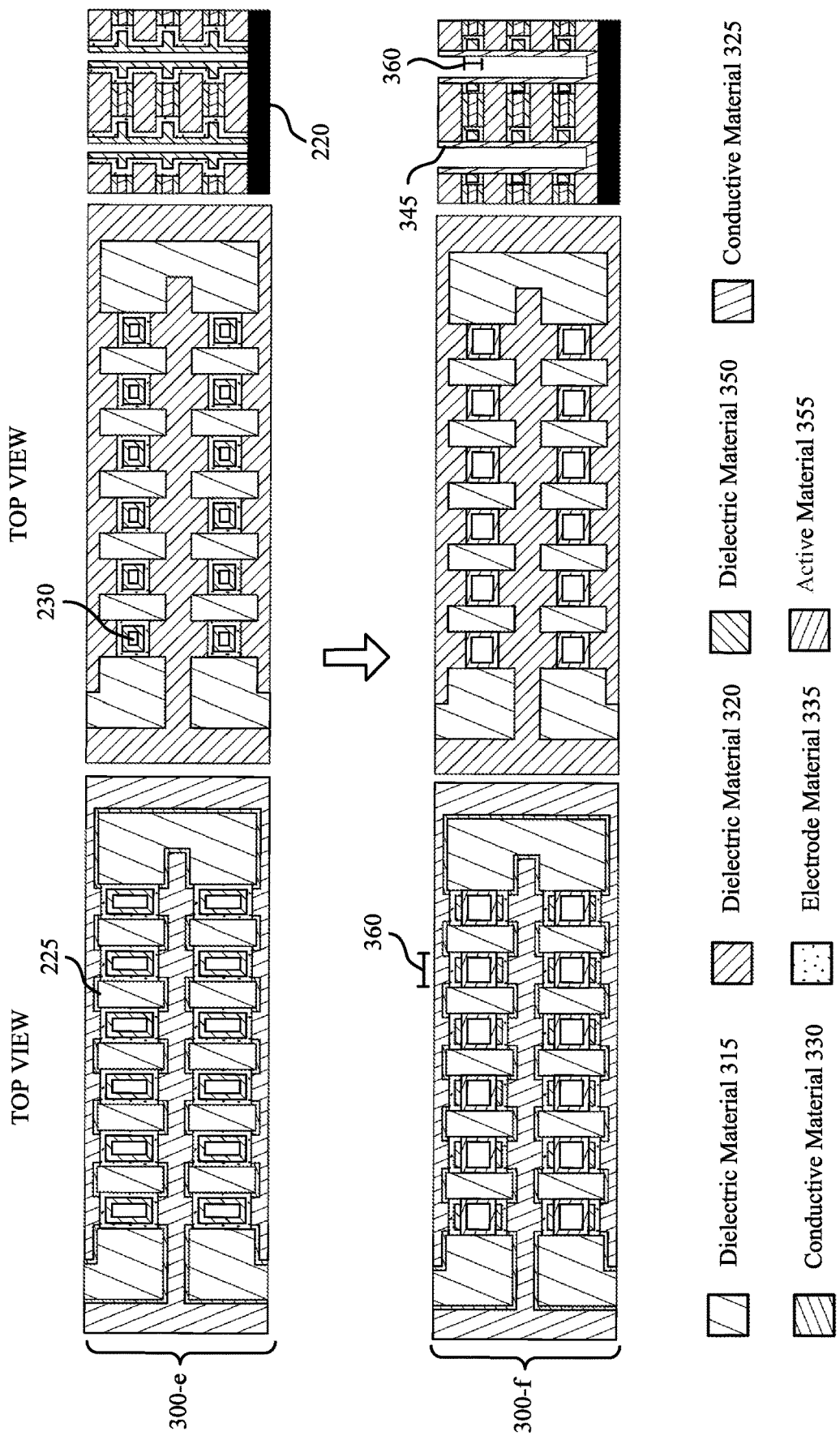

FIG. 3C illustrates a portion 300-e of the material arrangement after an eighth set of one or more manufacturing operations and a portion 300-f after a ninth set of one or more manufacturing operations. The eighth set of one or more manufacturing operations may occur after the seventh set of one or more manufacturing operations. The eighth set of operations may include depositing a dielectric material 350 on the exposed surface of the material arrangement, which may include depositing the dielectric material 350 in contact with or otherwise over the electrodes 340. As shown in FIG. 3C, the dielectric material may fill the remaining portions of the voids 305 not occupied by the electrode material 335. In some examples, the dielectric material may include a nitride.

The ninth set of one or more manufacturing operations may occur after the eighth set of one or more manufacturing operations and may include forming memory cells 345. For example, the ninth set of operations may include removing (e.g., etching or exhuming) exposed portions of the dielectric material 350 and the electrode material 335, which may recess the dielectric material 350 and the electrode material 335 to be within the voids 305, and which may expose the sidewalls of the first material (e.g., the dielectric material 320). Such operation may clear the dielectric material 350 and the electrode material 335 from the cavities 230. In some examples, the dielectric material 350 may fill, such as completely fill, the remaining portions of the voids 305 not occupied by the electrode material 335. Moreover, the exposed surface of the dielectric material 350 and the electrode material 335 may be formed or otherwise processed to be flush or in line with the exposed surfaces of the first material (e.g., the dielectric material 350). As illustrated in FIG. 3D, the electrode 340 may form a shape, such as a cup shape, surrounding the dielectric material 350. As such, the surface area of the electrode 340 exposed to the cavity 230 may be based on a width 360 (e.g., W), a height 365 (e.g., h), and a thickness of the electrode material 350 (e.g., t). For example, an equation for the surface area of the electrode 340 may be $SA_{electrode} = t*(2*(W+h))$.

The ninth set of the one or more manufacturing operations may include depositing an active material 355 on the exposed surface of the cavities 230, which may include depositing the active material 355 in contact with or otherwise over the layers of the first material (e.g., the dielectric material 350), in contact with or otherwise over the exposed surface of the electrodes 340, and in contact with or otherwise over the substrate 220. The contact area between the active material 355 and the electrode material 335 may be equal to $SA_{electrode}$. In some examples, the active material may be deposited using ALD techniques. That is, the active material 355 may be deposited as thin film using sequence of gas-phase chemical processes. The active material 355 may in some examples include a chalcogenide material, which may support portions of the active material 355 being formed in and operated as respective memory cells 345.

Figure 4:
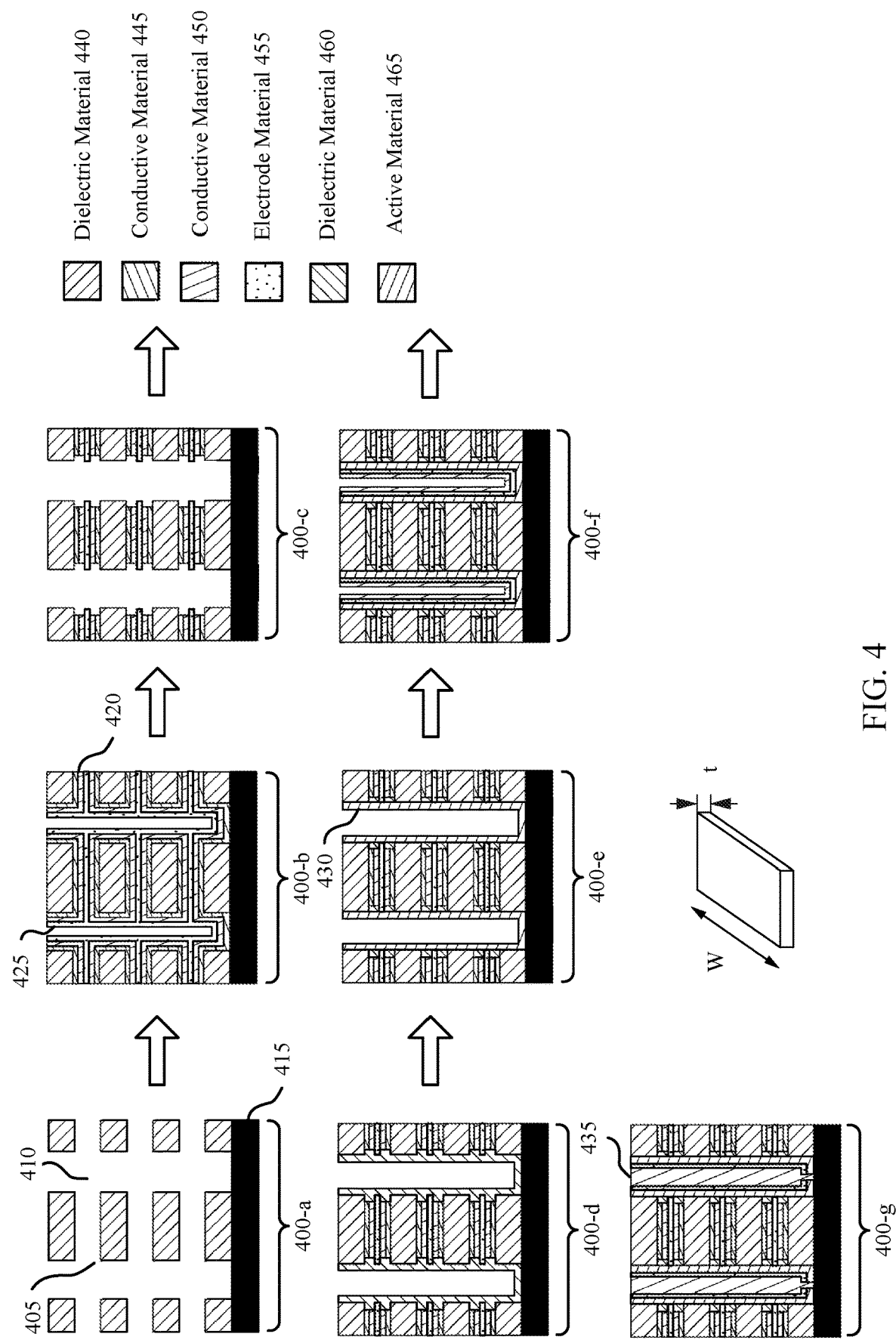

FIG. 4 illustrates examples of portions 400 (e.g., a portion 400-a, a portion 400-b, a portion 400-c, a portion 400-d, a portion 400-e, a portion 400-f, and a portion 400-g) of the material arrangement after a tenth set of one or more manufacturing operations. In some examples, the tenth set of one or more manufacturing operations may replace at least some if not all of the fourth set of one or more manufacturing operations through the ninth set of one or more manufacturing operations and may occur after the third set of one or more manufacturing operations. Similar to section B-B portions shown in FIGS. 2 and 3, the portions 400 may be cross-sections of the material arrangement. Specifically, the portions 400 may be cross-sections taken from the center of two cavities 410 (e.g., two adjacent cavities 410) of the material arrangement.

As illustrated by the portion 400-a, the tenth set of one or more manufacturing operations may support forming voids 405 between layers of material. For example, the tenth set of one or more manufacturing operations may include removing (e.g., etching or exhuming) a second material (e.g., a second material 210) which may form a set of voids 405 between the layers of a first material (e.g., a dielectric material 440). The tenth set of one or more manufacturing operations may expose sidewall, or a portion thereof, of a set of piers (e.g., piers 225). Moreover, the portion 400-a may illustrate a set of cavities 410 formed through the layers of material. The cavities 410 may be formed using the first set of one or more manufacturing operations as described in FIG. 2A.

The tenth set of one or more manufacturing operations may include forming a set of word lines 420 and a set of electrodes 425 as illustrated by portion 400-b. To form the word lines 420, the tenth set of one or more manufacturing operations may include depositing one or more conductive materials (e.g., one or more of a conductive material 445 and a conductive material 450) in the set of voids 405. The conductive material 445 may be deposited on exposed surfaces of the material arrangement which may include depositing the conductive material 445 in contact with or otherwise over the layers of the first materials (e.g., the dielectric material 440), in contact with or otherwise over the substrate 415, and in contact with or otherwise over the exposed sidewall, or portions thereof of the piers. Moreover, the conductive material 450 may be deposited on the exposed surfaces of the conductive material 445. In some examples, the conductive material 445 may be an example of a conductive material 325 as described in FIGS. 3A, 3B, and 3C and the conductive material 450 may be an example of a conductive material 330 as described in FIGS. 3A, 3B, and 3C.

In some examples, the tenth set of one or more manufacturing operations may include forming electrodes 425. For example, the tenth set of one or more manufacturing operations may include depositing electrode material 455, for example, on the exposed surfaces of the conductive material 450. In some examples, the electrode material 455 may fill the remaining portion of the set of voids 405 (e.g., not occupied by the conductive material 445 and the conductive material 450). In some examples, the electrode material 455 may be an example of an electrode material 335 as described in FIGS. 3B and 3C.

As illustrated by portion 400-c, the tenth set of one or more manufacturing operations may include removing (e.g., exhuming or etching) portions of the conductive material 445, the conductive material 450, and the electrode material 455, which may recess the conductive material 445, the conductive material 450, and the electrode material 455 to be within the voids 405. In some examples, the removal of the material may be selective. That is, a recession of the conductive materials (e.g., the conductive material 445 or the conductive material 450) may be more or less than a recession of the electrode material 455. As illustrated by the portion 400-c, the conductive materials may be recessed further in the set of voids 405 than the electrode material 455. As such, portions of the set of voids 305 may be unfilled by the conductive material, whereas the electrodes 425 may extend through the length of the void 405. In some examples, a surface of the electrodes 425 exposed to the cavities 410 may be flush or in line with the layers of the first material (e.g., the dielectric material 440).

Moreover, the tenth set of one or more manufacturing operations may include depositing a dielectric material 460 on the exposed surfaces of the material arrangement as shown by portion 400-d, which may include depositing the dielectric material 460, for example in contact with or otherwise over the electrodes 425, for example in contact with or otherwise over the word lines 420, and for example in contact with or otherwise over the substrate 415. In some examples, the dielectric material 460 may be an example of a dielectric material 350 as described in FIG. 3C.

As shown by portion 400-e, the tenth set of one or more manufacturing operations may include removing (e.g., etching or exhuming) exposed portions of the dielectric material 460, which may recess the dielectric material 460 to be within the voids 405. Such operation may clear the dielectric material 460 from the cavities 410. In some examples, the dielectric material 460 may fill the remaining portions of the voids 405 not occupied by the word lines 420 or the electrodes 425. Moreover, the exposed surfaces of the dielectric material 460 and the electrode material 455 may be flush or in line with the exposed surface of the first material (e.g., the dielectric material 350). The electrodes 425 may form a plate between the dielectric material 460. The surface area of the exposed surface of the electrodes 425 (e.g., exposed to the cavity 410) may be based on a width (e.g., W, a width of the cavity 410) and a thickness of the electrode material 455 (e.g., t). For example, an equation for the surface area of the electrodes 425 may be $SA_{electrode}=t*W$.

The tenth set of one or more manufacturing operations may include forming memory cells 430. For example, the tenth set of one or more manufacturing operation may include depositing an active material 465 on the exposed surface of the cavity 410, which may include depositing the active material 465, for example in contact with or otherwise over the layers of the first material (e.g., the dielectric material 440), for example in contact with or otherwise over the exposed surface of the electrodes 425, and for example in contact with or otherwise over the substrate 415. In some examples, the active material 465 may be deposited using ALD techniques. The contact area between the electrodes 425 and the active material 465 may be equal to $SA_{electrode}$. The active material 465 may be an example of the active material 355 as described in FIG. 3C. Portions of the active material 465 may be formed and operated as respective memory cells 430.

As shown by portion 500-*f*, the tenth set of one or more manufacturing operations may include depositing the electrode material 455 on exposed surfaces of the active material 465 to form electrodes 425 and depositing conductive material 450 on exposed surfaces of the electrode material 455. In some examples, the conductive material 450 may be an example of a conductive material 325 as described in FIGS. 3A, 3B, and 3C.

The tenth set of one or more manufacturing operations may include operations that support forming pillars 435 in the set of cavities 410 as illustrated by the portion 400-*g*. For example, the tenth set of one or more manufacturing operations may include removing a portion of the active material 465 and the conductive material 450 (e.g., punch etch). As shown by portion 400-*g*, the portion of the active material 465 and the conducive material 450 may be removed, for example, through a surface that is parallel to the substrate 415 such that a portion of the substrate 415 is exposed to the cavities 410. The result of removing the portion of the active material 465 and the conductive material may be void between the cavities 410 and the substrate 415. The tenth set of one or more manufacturing operations may include depositing the conductive material 450 in the cavity 410, which may include depositing the conductive material in contact with or otherwise over the exposed surfaces of the conductive material 450, in contact with or otherwise over the exposed surfaces of the active material 465, the exposed surfaces of the electrode material 455, and the exposed surfaces of the substrate 415. That is, the conductive material 450 may fill the remaining portions of the cavity 410 as well as the void between the substrate 415 and the cavity 410. The material arrangement may include pillars 435 formed at least from the conductive material 450.

Figure 5:
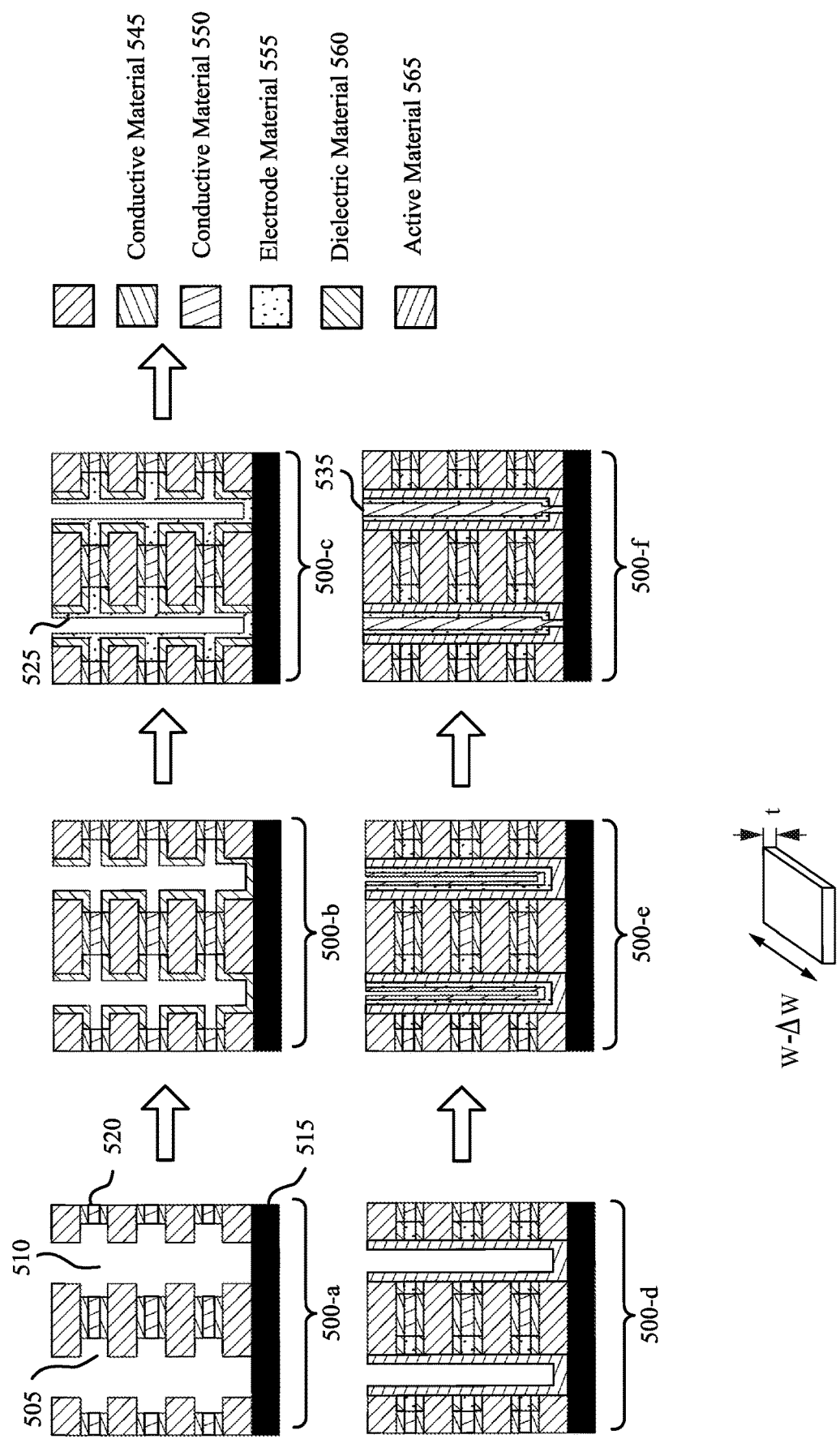

FIG. 5 illustrates examples of portions 500 (e.g., a portion 500-*a*, a portion 500-*b*, a portion 500-*c*, a portion 500-*d*, a portion 500-*e*, and a portion 500-*f*) of the material arrangement after an eleventh set of one or more manufacturing operations. In some examples, the eleventh set of one or more manufacturing operations may replace at least some of if not all of the sixth set of the one or more manufacturing operations through the ninth set of one or more manufacturing operations and/or the tenth set of one or more manufacturing operations. Moreover, the sixth set of the one or more manufacturing operations may occur after fifth set of the one or more manufacturing operations. Similar to section B-B portions shown in FIGS. 2 and 3, the portions 500 are cross-sections of a portion of the material arrangement. Specifically, the portions 500 may be cross-sections taken from the center of two cavities 510 (e.g., two adjacent cavities 510) of the material arrangement.

As illustrated by the portion 500-*a*, the eleventh set of one or more manufacturing operations may include forming word lines 520. The word lines 520 may be formed using operations similar to the operations described in the fifth set of one or more manufacturing operations. That is, the word lines 520 may be formed based on depositing a conductive material 545 and a conductive material 550 into a set of voids 505 (e.g., spaces between the layers of a dielectric material 540) and removing a portion of the conductive material 545 and the conductive material 550 such that the conductive material 545 and the conductive material 550 is within the voids 505 and removed from the cavities 510. The cavities 510 may be formed using the third set of one or more manufacturing operations and the voids 505 may be formed using the fourth set of the one or more manufacturing operations.

As illustrated by portion 500-*b*, the eleventh set of one or more manufacturing operations may include depositing a dielectric material 560 on the exposed surface of the layers of a first material (e.g., the dielectric material 540). In some examples, the dielectric material 560 may not be deposited on the exposed surface of the word lines 520. That is, the dielectric material 560 may be selectively deposited on the dielectric material 540 (e.g., selective dielectric growth on the dielectric walls). In some examples, the dielectric material 560 may be an example of a dielectric material 320 and a dielectric material 460 as described in FIGS. 3C and 4.

In some examples, the eleventh set of one or more manufacturing operations may include operations the support forming electrodes 525 as illustrated by portion 500-*c*. For example, the eleventh set of one or more manufacturing operations may include depositing electrode material 555 onto the exposed surfaces of the material arrangement. That is, the electrode material 555 may be in contact with or otherwise over the exposed surfaces of the dielectric material 560, in contact with or otherwise over the exposed surfaces of the word lines 520, and in contact with or otherwise over the substrate 515. The electrode material 555 may fill the remaining portions of the voids 505 and may be situated between the dielectric material 560. In some examples, the electrode material 555 may be an example of an electrode material 335 and an electrode material 455 as described in FIGS. 3B, 3C, and 4.

As illustrated by the portion 500-*d*, the eleventh set of the one or more manufacturing operations may include operations that support forming a set of memory cells 530. For example, the eleventh set of the one or more manufacturing operations may include removing (e.g., etching or exhuming) a portion of the dielectric material 560 and the electrode material 555 such that the dielectric material 560 and the electrode material 555 are within the set of voids 505. In some examples, the exposed surfaces of the dielectric material 560 and the exposed surfaces of the electrode material 555 may be flush with the exposed surfaces of the layers of the first material (e.g., the exposed surface of the dielectric material 540). As shown by portion 500-*d*, the electrode 525 may form a plate between the dielectric material 560. The surface area of the exposed surface of the electrode 525 (e.g., exposed to the cavity 510) may be based on a width (e.g., W, a width of the cavity 410) and a thickness of the electrode material (e.g., t) and may consider the dielectric growth on the lateral walls (e.g., ΔW, thickness of dielectric growth on lateral walls). For example, an equation for the surface area of the electrode 525 may be $SA_{electrode} = t*(W-\Delta W)$.

The eleventh set of one or more manufacturing operations may include forming memory cells 530. For example, the eleventh set of one or more manufacturing operations may include depositing an active material 565 on the exposed surface of the cavity 510, which may include depositing the active material 565 in contact with or otherwise over the exposed surface of the dielectric material 560, in contact with or otherwise over the exposed surface of the electrode material 555, and in contact with or otherwise over the substrate 515. In some examples, the active material 565 may be deposited using ALD techniques. The contact area between the electrodes 525 and the active material 565 may be equal to $SA_{electrode}$. The active material 565 may be an example of an active material 355 and an active material 465 as described in FIGS. 3C and 4. Portions of the active material 565 may be formed and operated as respective memory cells 530.

As shown by portion 500-e, the eleventh set of one or more manufacturing operations may include depositing the electrode material 555 on exposed surfaces of the active material 355 to form electrodes 525 and depositing conductive material 550 on exposed surfaces of the electrode material 555. In some examples, the conductive material 550 may be an example of a conductive material 325 and a conductive material 450 as described in FIGS. 3A, 3B, 3C, and 4.

The eleventh set of one or more manufacturing operations may include operations that support forming pillars 535 in the set of cavities 510 as illustrates by the portion 500-f. For example, the eleventh set of one or more manufacturing operations may include removing a portion of the active material 565 and the conductive material 550. As shown by portion 500-e, the portion of the active material 565 and the conducive material 550 may be removed through a surface that is parallel to the substrate 515 such that a portion of the substrate 515 is exposed to the cavities 510. The result of removing the portion of the active material 565 and the conductive material may be void between the cavities 510 and the substrate 515. The eleventh set of one or more manufacturing operations may include depositing the conductive material 550 in the cavity 510, which may include depositing the conductive material in contact with or otherwise over the exposed surfaces of the conductive material 550, in contact with or otherwise over the exposed surfaces of the active material 565, the exposed surfaces of the electrode material 555, and the exposed surfaces of the substrate 515. That is, the conductive material 550 may fill the remaining portions of the cavity 510 as well as the void between the substrate 515 and the cavity 510. The material arrangement may include pillars 535 formed at least from the conductive material 550.

Figure 6:
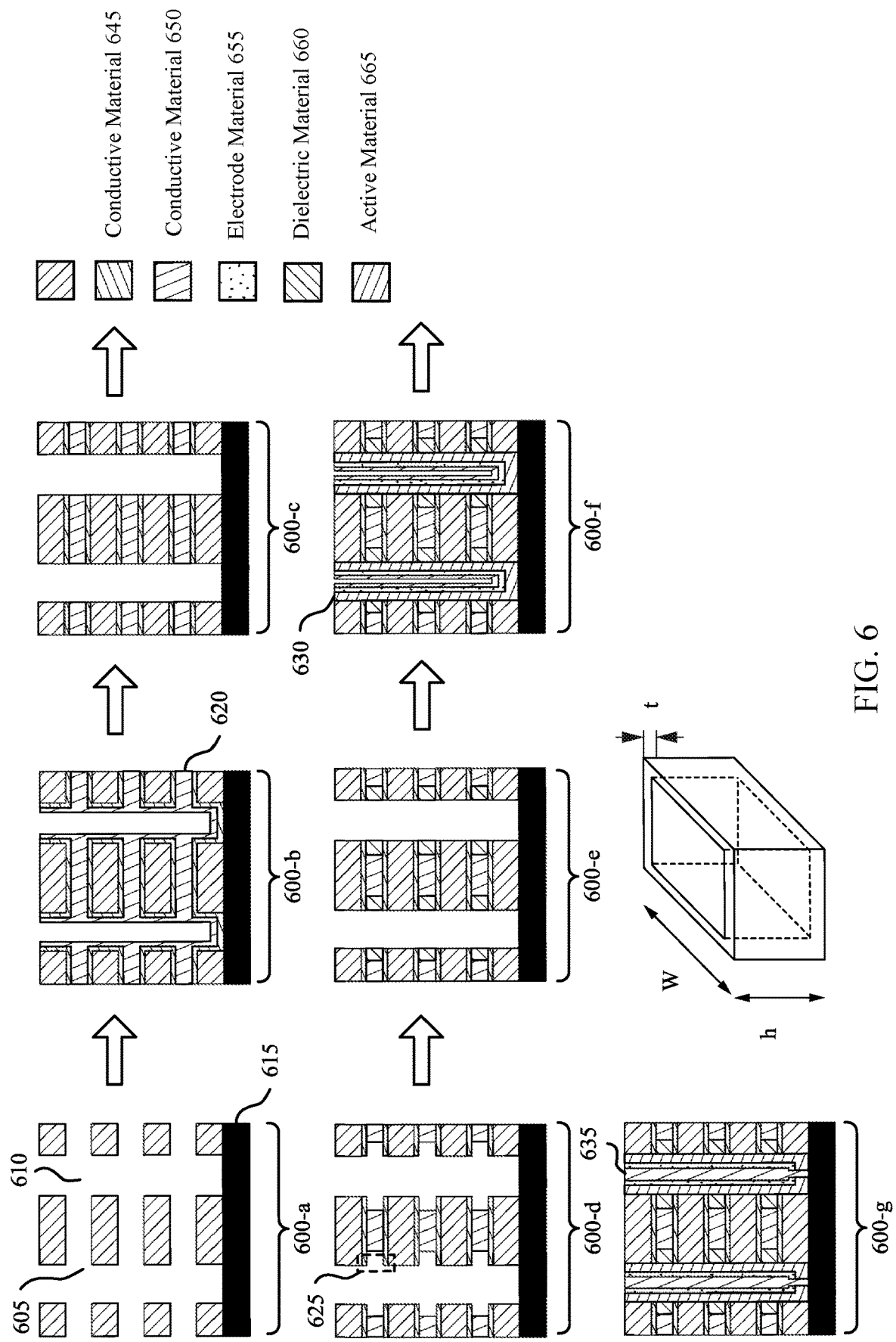

FIG. 6 illustrates examples of portions 600 (e.g., a portion 600-a, a portion 600-b, a portion 600-c, a portion 600-d, a portion 600-e, a portion 600-f, and a portion 600-g) of the material arrangement after a twelfth set of one or more manufacturing operations. In some examples, the twelfth set of one or more manufacturing operations may replace at least some of if not all of the fourth set of one or more manufacturing operations through the ninth set of one or more manufacturing operations, the tenth set of one or more manufacturing operations, and the eleventh set of one or more manufacturing operations. Moreover, the twelfth set of one or more manufacturing operations may occur after the third set of one or more manufacturing operations. Similar to section B-B portions as shown in FIGS. 2 and 3, the portions 600 may be cross-sections of the material arrangement. Specifically, the portions 600 may be cross-sections taken from the center of two cavities 610 (e.g., two adjacent cavities 610) of the material arrangement.

As illustrated by the portion 600-a, the twelfth set of one or more manufacturing operations may support operations for forming voids 605 between layers of material. For example, the twelfth set of one or more operations may include removing (e.g., etching or exhuming) a second material (e.g., a second material 210) which may form a set of voids 605 between layers of a first material (e.g., a dielectric material 640). The twelfth set of one or more manufacturing operations may expose sidewall, or a portion thereof, of a set of piers (e.g., piers 225). Moreover, the portion 600-a may illustrate a set of cavities 610 formed through the layers of materials (e.g., layers of the first material). The cavities 610 may be formed using the first set of the one or more manufacturing operations as described in FIG. 2A.

The twelve set of the one or more manufacturing operations may include operations that support forming a set of word lines 620 as illustrated by portion 600-b. To form the word lines 620, the twelfth set of one or more manufacturing operations may include depositing one or more conductive materials (e.g., one or more of a conductive material 645 and a conductive material 650) on the set of voids 605. The conductive material 645 may be deposited on the exposed surfaces of the material arrangement which may include depositing the conductive material in contact with or otherwise over the layers of the first material (e.g., the dielectric material 640), in contact with or otherwise over the substrate 415, and in contact with or otherwise over the exposed sidewall, or portions thereof of the piers. Moreover, the conductive material 650 may be deposited on the exposed surfaces of the conductive material 645. In some examples, the conductive material 645 may be an example of a conductive material 325, a conductive material 445, and a conductive material 545 as described in FIGS. 3A, 3B, 3C, 4, and 5. In some examples, the conductive material 450 may be an example of a conductive material 330, a conductive material 450, and a conductive material 550 as described in FIGS. 3A, 3B, 3C, 4, and 5.

As illustrated by the portion 600-c, the twelfth set of one or more manufacturing operations may include removing (e.g., exhuming or etching) portions of the conductive material 645 and the conductive material 650, which may recess that conductive material 645 and the conductive material 650 to be within the set of voids 605. In some examples, the voids 605 may be completely filled by the conductive material 645 and the conductive material 650. As such, the exposed surfaces of the conductive material 645 and the conductive material 650 may be flush or in line with the exposed surfaces of the layers of the first material (e.g., the dielectric material 640).

In some examples, as illustrated by the portion 600-d, the twelfth of the one or more manufacturing operations may include removing portions of the conductive material 650, which may further recess that conductive material 650 in the set of voids 605. Removing the portion of the conductive material 650 may result in a portion of the set of voids 605 being unfilled. In some examples, the portions of the conductive material 645 not in contact or coupled with the conductive material 650 may function or operate as an electrode 625. The exposed surface area of the conductive material 645 (e.g., exposed to the cavity 610) may be based on a width (e.g., W, a width associated with the cavity 610), a height (e.g., h, a height of the void 605), and a thickness of the conductive material 645 (e.g., t). For example, the equation for the surface area of the conductive material 645 may be $SA_{electrode} = t*(2*(W+h))$.

As shown by portion 600-e, the twelfth set of one or more manufacturing operations may include depositing a dielectric material 600 on the exposed surface of the material arrangement and removing (e.g., exhuming or etching) a portion of the dielectric material 660, which may recess the dielectric material 660 in the set of voids 605. In some examples, the dielectric material 660 may fill the remaining portions of the set of voids 605 and in some example, the exposed surfaces of the dielectric material 660 may be flush or in line with the exposed surfaces of the conductive material 645 and the exposed surfaces of the first material (e.g., the dielectric material 640). As shown by the portion 600-e, the conductive material 645 and the conductive material 650 may form a cup shape surrounding the dielectric material 660. The dielectric material 660 may be an example of a dielectric material 350, a dielectric material 460, and a dielectric material 560 as described in FIGS. 3C, 4, and 5.

In some examples, as illustrated by the portion 600-f, the twelfth set of one or more manufacturing operations may include operations that support forming a set of memory cells 630. For example, the twelfth set of one or more manufacturing operations may include depositing an active material 665 on the exposed surfaces of the cavity 610, which may include depositing the active material 665 in contact with or otherwise over the layers of the first material (e.g., the dielectric material 640), in contact with or otherwise over the exposed surface of the conductive material 645, in contact with or otherwise over the exposed surface of the dielectric material 660, and in contact with or otherwise over the substrate 615. In some examples, the active material may be deposited using ALD techniques. The contact are between the active material 665 and the conductive material 645 may be equal to $SA_{electrode}$. The active material may be an example of an active material 355, an active material 460, and an active material 560 as described in FIGS. 3C, 4, and 5. Portions of the active material 665 may be formed and operated as respective memory cells 630.

Moreover, the twelfth set of one or more manufacturing operations may include depositing electrode material on the exposed surfaces of the active material 465 to form electrodes 625 and depositing conductive material 650 on exposed surfaces of the electrode material 655. In some examples, the electrode material 655 may be an example of an electrode material 335, an electrode material 455, and an electrode material 555 as described in FIGS. 3B, 3C, 4, and 5.

The twelfth set of one or more manufacturing operations may include operations that support forming pillars 635 in the set of cavities 610 as illustrated by the portion 600-g. For example, the twelfth set of one or more manufacturing operations may include removing a portion of the active material 665 and the conductive material 650. As shown by portion 400-g, the portion of the active material 665 and the conducive material 650 may be removed through a surface that is parallel to the substrate 615 such that a portion of the substrate 615 is exposed to the cavities 610. The result of removing the portion of the active material 665 and the conductive material may be a void between the cavities 610 and the substrate 615. The twelfth set of one or more manufacturing operations may include depositing the conductive material 650 in the cavity 610, which may include depositing the conductive material in contact with or otherwise over the exposed surfaces of the conductive material 650, in contact with or otherwise over the exposed surfaces of the active material 665, the exposed surfaces of the electrode material 655, and the exposed surfaces of the substrate 615. That is, the conductive material 650 may fill the remaining portions of the cavity 610 as well as the void between the substrate 615 and the cavity 610. The material arrangement may include pillars 635 formed at least from the conductive material 650.

Figure 7:
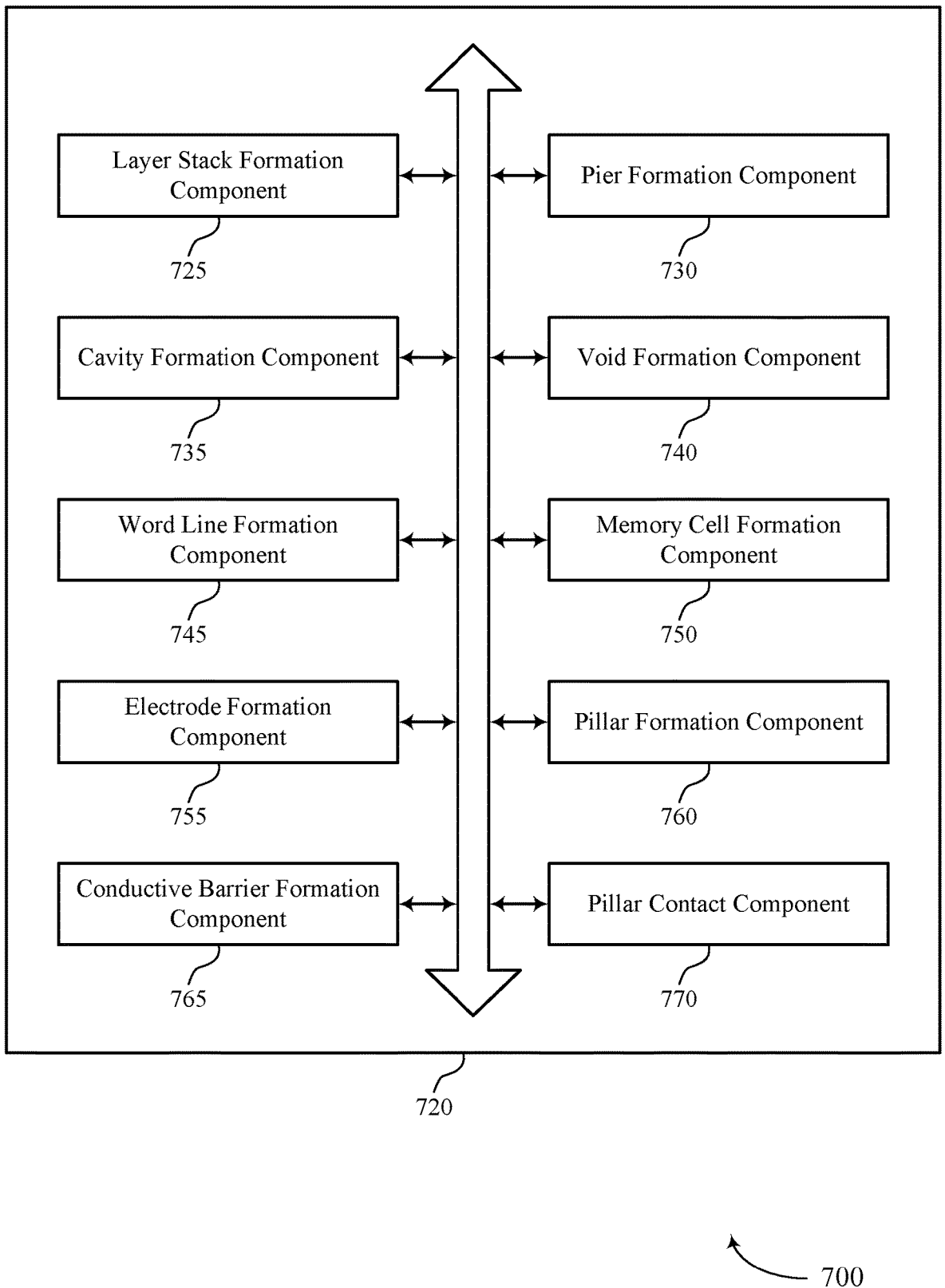
FIG. 7 shows a block diagram of a process controller that supports memory cell formation in three dimensional memory arrays using ALD in accordance with examples as disclosed herein.

FIG. 7 shows a block diagram 700 of a process controller 720 that supports memory cell formation in three dimensional memory arrays using ALD in accordance with examples as disclosed herein. The process controller 720 may be an example of aspects of a process controller as described with reference to FIGS. 1 through 6. The process controller 720, or various components thereof, may be an example of means for performing various aspects of memory cell formation in three dimensional memory arrays using ALD as described herein. For example, the process controller 720 may include a layer stack formation component 725, a pier formation component 730, a cavity formation component 735, a void formation component 740, a word line formation component 745, a memory cell formation component 750, an electrode formation component 755, a pillar formation component 760, a conductive barrier formation component 765, a pillar contact component 770, or any combination thereof. Each of these components may communicate, directly or indirectly, with one another (e.g., via one or more buses).

The layer stack formation component 725 may be configured as or otherwise support a means for depositing a stack of layers over a substrate, the stack of layers including alternating layers of a first material and a second material, the first material including a dielectric material. The pier formation component 730 may be configured as or otherwise support a means for forming a plurality of piers through the stack of layers based at least in part on forming a plurality of cavities through the stack of layers and filling the plurality of cavities with a third material. The cavity formation component 735 may be configured as or otherwise support a means for forming a plurality of second cavities through the stack of layers. The void formation component 740 may be configured as or otherwise support a means for forming a plurality of voids between the layers of the stack of layers based at least in part on removing the second material. The word line formation component 745 may be configured as or otherwise support a means for forming a plurality of word lines between the layers based at least in part on depositing a first conductive material in the plurality of voids. The memory cell formation component 750 may be configured as or otherwise support a means for forming a plurality of memory cells on an inside surface of the plurality of second cavities based at least in part on depositing an active material on the inside surface of the plurality of second cavities using ALD.

In some examples, the electrode formation component 755 may be configured as or otherwise support a means for forming a first plurality of electrodes between the layers based at least in part on depositing electrode material in the plurality of voids.

In some examples, the conductive barrier formation component 765 may be configured as or otherwise support a means for forming a plurality of conductive barriers between the layers based at least in part on depositing a second conductive material in the plurality of voids, where each conductive barrier of the plurality contacts a respective memory cell of the plurality of memory cells.

In some examples, each electrode of the first plurality of electrodes is between a respective memory cell of the plurality of memory cells and a respective word line of the plurality of word lines.

In some examples, each electrode of the first plurality of electrodes contacts at least four different surfaces of a respective conductive barrier of the plurality of conductive barriers.

In some examples, each electrode of the first plurality of electrodes contacts a respective memory cell of the plurality of memory cells. In some examples, a contact area between each electrode of the first plurality of electrodes and the respective memory cell of the plurality of memory cells is based at least in part on a width associated with a respective second cavity of the plurality of second cavities, a height associated with the respective conductive barrier of the plurality of conductive barriers, and a thickness associated with each electrode.

In some examples, each electrode of the first plurality of electrodes contacts a respective memory cell of the plurality of memory cells. In some examples, a contact area between the each electrode of the first plurality of electrodes and the respective memory cell of the plurality of memory cells is based at least in part on a width associated with a respective second cavity of the plurality of cavities and a thickness associated with each electrode.

In some examples, the void formation component 740 may be configured as or otherwise support a means for forming a second plurality of voids based at least in part on etching the plurality of word lines, where forming the plurality of first electrodes is based at least in part on filling the second plurality of voids with the first conductive material.

In some examples, each electrode of the first plurality of electrodes contacts a respective memory cell of the plurality of memory cells. In some examples, a contact area between each electrode of the first plurality of electrodes and the respective memory cell of the plurality of memory cells is based at least in part on a width associated with a respective second cavity of the plurality of second cavities and a thickness associated with each electrode.

In some examples, the electrode formation component 755 may be configured as or otherwise support a means for forming a plurality of second electrodes based at least in part on depositing a third conductive material in the plurality of second cavities and on top of the active material.

In some examples, the pillar formation component 760 may be configured as or otherwise support a means for forming a plurality of pillars based at least on part on depositing a fourth conductive material in the plurality of second cavities and on top of the second conductive material.

In some examples, the pillar contact component 770 may be configured as or otherwise support a means for etching laterally through the active material such that the plurality of pillars are contacting the substrate.

Figure 8:
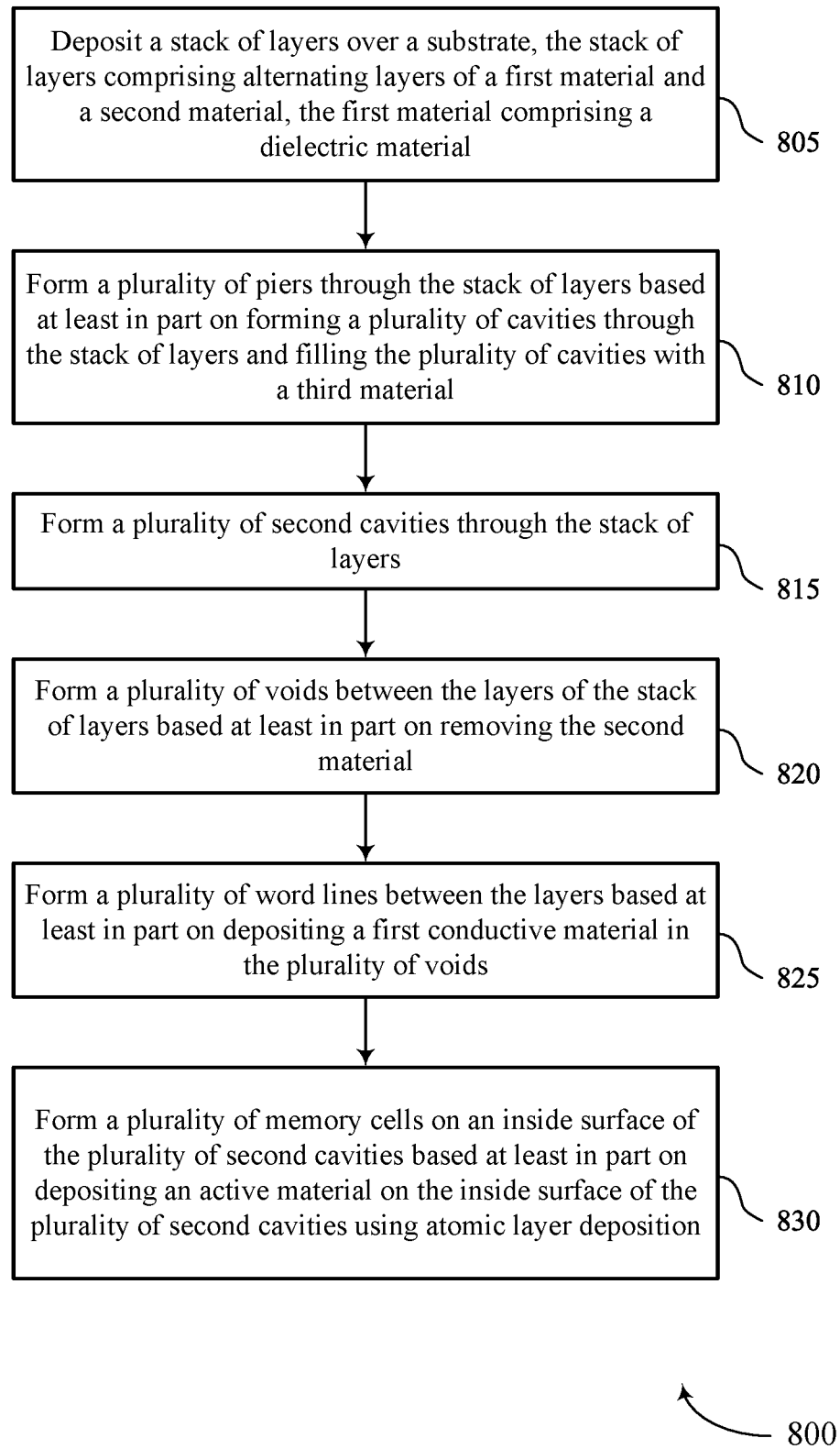
FIG. 8 shows a flowchart illustrating a method or methods that support memory cell formation in three dimensional memory arrays using ALD in accordance with examples as disclosed herein.

FIG. 8 shows a flowchart illustrating a method 800 that supports memory cell formation in three dimensional memory arrays using ALD in accordance with examples as disclosed herein. The operations of method 800 may be implemented by a process controller or its components as described herein. For example, the operations of method 800 may be performed by a process controller as described with reference to FIGS. 1 through 7. In some examples, a process controller may execute a set of instructions to control the functional elements of the device to perform the described functions. Additionally, or alternatively, the process controller may perform aspects of the described functions using special-purpose hardware.

At 805, the method may include depositing a stack of layers over a substrate, the stack of layers including alternating layers of a first material and a second material, the first material including a dielectric material. The operations of 805 may be performed in accordance with examples as disclosed herein. In some examples, aspects of the operations of 805 may be performed by a layer stack formation component 725 as described with reference to FIG. 7.

At 810, the method may include forming a plurality of piers through the stack of layers based at least in part on forming a plurality of cavities through the stack of layers and filling the plurality of cavities with a third material. The operations of 810 may be performed in accordance with examples as disclosed herein. In some examples, aspects of the operations of 810 may be performed by a pier formation component 730 as described with reference to FIG. 7.

At 815, the method may include forming a plurality of second cavities through the stack of layers. The operations of 815 may be performed in accordance with examples as disclosed herein. In some examples, aspects of the operations of 815 may be performed by a cavity formation component 735 as described with reference to FIG. 7.

At 820, the method may include forming a plurality of voids between the layers of the stack of layers based at least in part on removing the second material. The operations of 820 may be performed in accordance with examples as disclosed herein. In some examples, aspects of the operations of 820 may be performed by a void formation component 740 as described with reference to FIG. 7.

At 825, the method may include forming a plurality of word lines between the layers based at least in part on depositing a first conductive material in the plurality of voids. The operations of 825 may be performed in accordance with examples as disclosed herein. In some examples, aspects of the operations of 825 may be performed by a word line formation component 745 as described with reference to FIG. 7.

At 830, the method may include forming a plurality of memory cells on an inside surface of the plurality of second cavities based at least in part on depositing an active material on the inside surface of the plurality of second cavities using ALD. The operations of 830 may be performed in accordance with examples as disclosed herein. In some examples, aspects of the operations of 830 may be performed by a memory cell formation component 750 as described with reference to FIG. 7.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for depositing a stack of layers over a substrate, the stack of layers including alternating layers of a first material and a second material, the first material including a dielectric material; forming a plurality of piers through the stack of layers based at least in part on forming a plurality of cavities through the stack of layers and filling the plurality of cavities with a third material; forming a plurality of second cavities through the stack of layers; forming a plurality of voids between the layers of the stack of layers based at least in part on removing the second material; forming a plurality of word lines between the layers based at least in part on depositing a first conductive material in the plurality of voids; and forming a plurality of memory cells on an inside surface of the plurality of second cavities based at least in part on depositing an active material on the inside surface of the plurality of second cavities using ALD.

Aspect 2: The method, apparatus, or non-transitory computer-readable medium of aspect 1, further including operations, features, circuitry, logic, means, or instructions, or any combination thereof for forming a first plurality of electrodes between the layers based at least in part on depositing electrode material in the plurality of voids.

Aspect 3: The method, apparatus, or non-transitory computer-readable medium of aspect 2, further including operations, features, circuitry, logic, means, or instructions, or any combination thereof for forming a plurality of conductive barriers between the layers based at least in part on depositing a second conductive material in the plurality of voids, where each conductive barrier of the plurality contacts a respective memory cell of the plurality of memory cells.

Aspect 4: The method, apparatus, or non-transitory computer-readable medium of aspect 3 where each electrode of the first plurality of electrodes is between a respective memory cell of the plurality of memory cells and a respective word line of the plurality of word lines.

Aspect 5: The method, apparatus, or non-transitory computer-readable medium of aspect 4 where each electrode of the first plurality of electrodes contacts at least four different surfaces of a respective conductive barrier of the plurality of conductive barriers.

Aspect 6: The method, apparatus, or non-transitory computer-readable medium of aspect 5 where each electrode of the first plurality of electrodes contacts a respective memory cell of the plurality of memory cells and a contact area between each electrode of the first plurality of electrodes and the respective memory cell of the plurality of memory cells is based at least in part on a width associated with a respective second cavity of the plurality of second cavities, a height associated with the respective conductive barrier of the plurality of conductive barriers, and a thickness associated with each electrode.

Aspect 7: The method, apparatus, or non-transitory computer-readable medium of any of aspects 4 through 6 where each electrode of the first plurality of electrodes contacts a respective memory cell of the plurality of memory cells and a contact area between the each electrode of the first plurality of electrodes and the respective memory cell of the plurality of memory cells is based at least in part on a width associated with a respective second cavity of the plurality of cavities and a thickness associated with each electrode.

Aspect 8: The method, apparatus, or non-transitory computer-readable medium of any of aspects 2 through 7, further including operations, features, circuitry, logic, means, or instructions, or any combination thereof for forming a second plurality of voids based at least in part on etching the plurality of word lines, where forming the plurality of first electrodes is based at least in part on filling the second plurality of voids with the first conductive material.

Aspect 9: The method, apparatus, or non-transitory computer-readable medium of aspect 8 where each electrode of the first plurality of electrodes contacts a respective memory cell of the plurality of memory cells and a contact area between each electrode of the first plurality of electrodes and the respective memory cell of the plurality of memory cells is based at least in part on a width associated with a respective second cavity of the plurality of second cavities and a thickness associated with each electrode.

Aspect 10: The method, apparatus, or non-transitory computer-readable medium of any of aspects 1 through 9, further including operations, features, circuitry, logic, means, or instructions, or any combination thereof for forming a plurality of second electrodes based at least in part on depositing a third conductive material in the plurality of second cavities and on top of the active material.

Aspect 11: The method, apparatus, or non-transitory computer-readable medium of any of aspects 1 through 10, further including operations, features, circuitry, logic, means, or instructions, or any combination thereof for forming a plurality of pillars based at least on part on depositing a fourth conductive material in the plurality of second cavities and on top of the second conductive material.

Aspect 12: The method, apparatus, or non-transitory computer-readable medium of aspect 11, further including operations, features, circuitry, logic, means, or instructions, or any combination thereof for etching laterally through the active material such that the plurality of pillars are contacting the substrate.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 13: An apparatus, including: a plurality of layers of a first material, the first material including a dielectric material; a plurality of word lines between the layers of the first material; a plurality first electrodes formed at least partially between layers of the first material, each electrode of the plurality of first electrodes contacting a respective memory cell of the plurality; a plurality of cavities formed through layers of the first material; and a layer of active material deposited in the plurality of cavities and in contact with the plurality of first electrodes.

Aspect 14: The apparatus of aspect 13, further including: a plurality of conductive barriers between the layers of the first material, each conductive barrier contacting the layer of active material.

Aspect 15: The apparatus of aspect 14, where each electrode of the first plurality of electrodes is between the layer of active material and a respective word line of the plurality of word lines.

Aspect 16: The apparatus of aspect 15, where each electrode of the first plurality of electrodes contacts at least four different surfaces of a respective conductive barrier of the plurality of conductive barriers.

Aspect 17: The apparatus of aspect 16, where each electrode of the plurality of first electrodes contacts the layer of active material.

Aspect 18: The apparatus of any of aspects 15 through 17, where each electrode of the first plurality of electrodes contacts the layer of active material.

Aspect 19: The apparatus of any of aspects 14 through 18, where the plurality of first electrodes are formed in voids in the plurality of word lines.

Aspect 20: The apparatus of aspect 19, where each electrode of the first plurality of electrodes contacts the layer of active material.

Aspect 21: The apparatus of any of aspects 14 through 20, further including: a plurality of pillars formed in the plurality of cavities.

Aspect 22: The apparatus of aspect 21, where the plurality of pillars contact a substrate based at least in part on etching through the layer of active material.

An apparatus is described. The following provides an overview of aspects of the apparatus as described herein:

Aspect 23: An apparatus, including: a plurality of layers of a first material, the first material including a dielectric material; a plurality of word lines between layers of the first material; a plurality of cavities formed through layers of the first material; a layer of active material deposited in the plurality of cavities; and a plurality of electrodes deposited in the plurality of cavities and contacting the layer of active material.

Aspect 24: The apparatus of aspect 23, further including: a plurality of pillars formed in the plurality of cavities in contact with the layer of active material.

Aspect 25: The apparatus of aspect 24, where the plurality of pillars contact a substrate.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:

depositing a stack of layers over a substrate, the stack of layers comprising alternating layers of a first material and a second material, the first material comprising a dielectric material;

forming a plurality of piers through the stack of layers based at least in part on forming a plurality of cavities through the stack of layers and filling the plurality of cavities with a third material;

forming a plurality of second cavities through the stack of layers;

forming a plurality of voids between layers of the stack of layers based at least in part on removing the second material;

forming a plurality of word lines between the layers based at least in part on depositing a first conductive material in the plurality of voids;

forming electrode material in the plurality of voids and on an inside surface of each of the plurality of second cavities;

removing some of the electrode material such that a surface of a layer of the stack of layers comprising the dielectric material is flush with a surface of remaining electrode material in a respective void of the plurality of voids, the surface of the layer of the stack of layers and the surface of the remaining electrode material both being exposed to a cavity of the plurality of second cavities; and forming a plurality of memory cells on the inside surface of the plurality of second cavities based at least in part on depositing an active material on the inside surface of the plurality of second cavities using atomic layer deposition, the deposited active material contacting the surface of the layer that is exposed to the cavity and contacting the surface of the remaining electrode material that is exposed to the cavity.

2. The method of claim 1, further comprising:

forming a first plurality of electrodes between the layers based at least in part on forming the electrode material in the plurality of voids.

3. The method of claim 2, further comprising:

forming a plurality of conductive barriers between the layers based at least in part on depositing a second conductive material in the plurality of voids, wherein each conductive barrier of the plurality of conductive barriers contacts a respective memory cell of the plurality of memory cells.

4. The method of claim 3, wherein each electrode of the first plurality of electrodes is between a respective memory cell of the plurality of memory cells and a respective word line of the plurality of word lines.

5. The method of claim 4, wherein each electrode of the first plurality of electrodes contacts at least four different surfaces of a respective conductive barrier of the plurality of conductive barriers.

6. The method of claim 5, wherein:
each electrode of the first plurality of electrodes contacts a respective memory cell of the plurality of memory cells, and
a contact area between each electrode of the first plurality of electrodes and the respective memory cell of the plurality of memory cells is based at least in part on a width associated with a respective second cavity of the plurality of second cavities, a height associated with the respective conductive barrier of the plurality of conductive barriers, and a thickness associated with each electrode.

7. The method of claim 4, wherein:
each electrode of the first plurality of electrodes contacts a respective memory cell of the plurality of memory cells, and
a contact area between each electrode of the first plurality of electrodes and the respective memory cell of the plurality of memory cells is based at least in part on a width associated with a respective second cavity of the plurality of cavities and a thickness associated with each electrode.

8. The method of claim 2, further comprising:
forming a second plurality of voids based at least in part on etching the plurality of word lines, wherein forming the first plurality of electrodes is based at least in part on filling the second plurality of voids with the first conductive material.

9. The method of claim 8, wherein:
each electrode of the first plurality of electrodes contacts a respective memory cell of the plurality of memory cells, and
a contact area between each electrode of the first plurality of electrodes and the respective memory cell of the plurality of memory cells is based at least in part on a width associated with a respective second cavity of the plurality of second cavities and a thickness associated with each electrode.

10. The method of claim 1, further comprising:
forming a plurality of second electrodes based at least in part on depositing a second conductive material in the plurality of second cavities and on top of the active material.

11. The method of claim 1, further comprising:
forming a plurality of pillars based at least on part on depositing a third conductive material in the plurality of second cavities and on top of a second conductive material.

12. The method of claim 11, further comprising:
etching laterally through the active material such that the plurality of pillars are contacting the substrate.

* * * * *